(12) United States Patent
Grube et al.

(10) Patent No.: US 10,192,366 B2
(45) Date of Patent: Jan. 29, 2019

(54) INTERACTIVE GRAPHICAL USER INTERFACE (GUI) FOR DESIGNING PREFORM GEOMETRIES

(71) Applicant: The Boeing Company, Chicago, IL (US)

(72) Inventors: Robert W. Grube, Seattle, WA (US); Huseyin Erdim, Seattle, WA (US); Mitchell T. Lee, Seattle, WA (US); Stefanie A. Meier, Seattle, WA (US)

(73) Assignee: The Boeing Company, Chicago, IL (US)

( * ) Notice: Subject to any disclaimer, the term of this patent is extended or adjusted under 35 U.S.C. 154(b) by 267 days.

(21) Appl. No.: 15/174,770

(22) Filed: Jun. 6, 2016

(65) Prior Publication Data
US 2017/0352195 A1    Dec. 7, 2017

(51) Int. Cl.
  *G06F 3/0481* (2013.01)
  *G06T 15/08* (2011.01)
  *G06T 19/20* (2011.01)

(52) U.S. Cl.
  CPC .......... *G06T 19/20* (2013.01); *G06F 3/04815* (2013.01); *G06T 15/08* (2013.01); *G06T 2200/24* (2013.01)

(58) Field of Classification Search
  CPC ..... G06T 19/00; G06T 15/08; G06T 2200/24; G06F 3/04815; G06F 17/50
  See application file for complete search history.

(56) References Cited

U.S. PATENT DOCUMENTS

| | | | | |
|---|---|---|---|---|
| 2010/0286809 A1* | 11/2010 | Kataoka | ................ | G06F 17/50 700/99 |
| 2012/0310605 A1* | 12/2012 | Abe | .................... | G06F 17/5018 703/1 |
| 2016/0189433 A1* | 6/2016 | Dayde | .................... | G06T 19/20 345/419 |

\* cited by examiner

*Primary Examiner* — Jeffrey A Gaffin
*Assistant Examiner* — Bille M Dahir
(74) *Attorney, Agent, or Firm* — McDonnell Boehnen Hulbert & Berghoff LLP

(57) ABSTRACT

An example method is described that includes providing, for display, a three-dimensional (3D) model of a part. The method also includes receiving, via a graphical user interface, data defining a cutting plane. The cutting plane intersects the 3D model of the part and divides the 3D model into a first portion and a second portion. The method further includes determining a first set of minimum-volume bounding boxes that is tangent to the cutting plane and encloses the first portion of the 3D model, and determining a second set of minimum-volume bounding boxes that is tangent to the cutting plane and encloses the second portion of the 3D model. The method also includes providing a preform geometry for the part. The preform geometry includes the first set of minimum-volume bounding boxes and the second set of minimum-volume bounding boxes.

20 Claims, 21 Drawing Sheets

INTERACTIVE GRAPHICAL USER INTERFACE (GUI) FOR DESIGNING PREFORM GEOMETRIES

FIELD

The present disclosure relates generally to systems and methods for designing preform geometries, and more particularly, to systems and methods for designing preform geometries using a graphical user interface (GUI).

BACKGROUND

A preform is a formation of raw material that can be used to produce and manufacture a final part. In some instances, a preform may be formed by combining a number of smaller blocks of raw material to form a larger structure. The larger structure may have a shape that is close to a final shape of the part, such that the structure can be machined to produce a final part.

Joining technologies such as mechanical fastening or friction welding may be used to manufacture a preform. By way of example, with linear friction welding (LFW), one part is oscillated laterally in a linear reciprocating motion while pressed against another stationary part. The resulting friction heats the parts, and after a period of time, the two parts are brought into alignment and forged together.

In the past, engineers manufactured parts by starting with a solid block and then machining the block down to form a final part. The process of manufacturing a part from a preform allows complex shapes to be manufactured while saving raw material costs and manufacturing time. For instance, machining a final part from a preform wastes less excess material and less milling cutters and may therefore be more cost-effective than machining a part from a solid block. In addition, machining a final part from a preform may be faster than machining a final part form a solid block.

Today, engineers manually design preforms by looking at the geometry of a final part, and deciding how and where to divide the final part into a number of blocks that can be joined together to form a preform. After deciding on a desired division of the part into blocks, an engineer then analyzes the feasibility of fabricating a preform from the resulting blocks. It may, for instance, be impracticable or impossible to join some of the blocks in the manner contemplated by the engineer due to limitations of a joining technology. As an example, it may be impossible to join two blocks using LFW if the welding surface area between the two blocks exceeds a welding surface area threshold. Similarly, even if it is possible to join a first block to a second block, it may be impossible to then join the combination of the first and second blocks to a third block using LFW. Thus, evaluating the feasibility of fabricating a preform using LFW may involve calculating the welding surface areas of multiple welds.

Further, after deciding on a desired division of the part into blocks, the engineer may analyze the amount of raw material required to create the preform. For instance, the engineer may determine the dimensions of each of the blocks, and calculate the total volume of the preform based on the dimensions.

To design a preform that is easier to assemble or requires less raw material, the engineer may revise the division of the final part, and then reanalyze the feasibility of fabricating the preform and the required amount of raw material. The entire process of designing, analyzing, and revising a preform can take a number of hours, and may be especially time-intensive when dealing with parts having complex shapes. Improvements are therefore desired.

SUMMARY

In one example, a computer-implemented method is provided. The method includes providing, for display, a three-dimensional (3D) model of a part. The method also includes receiving, via a GUI, data defining a cutting plane. The cutting plane intersects the 3D model of the part and divides the 3D model into a first portion and a second portion. The method further includes determining a first set of minimum-volume bounding boxes that is tangent to the cutting plane and encloses the first portion of the 3D model, and determining a second set of minimum-volume bounding boxes that is tangent to the cutting plane and encloses the second portion of the 3D model. The method also includes providing a preform geometry for the part. The preform geometry includes the first set of minimum-volume bounding boxes and the second set of minimum-volume bounding boxes.

In another example, a computing device is provided. The computing device includes a processor and a computer-readable medium having stored therein instructions that are executable to cause the computing device to perform functions. The functions include receiving a 3D model of a part, and receiving data defining a cutting plane. The cutting plane intersects the 3D model of the part and divides the 3D model into a first portion and a second portion. The functions also include determining a first set of minimum-volume bounding boxes that is tangent to the cutting plane and encloses the first portion of the 3D model, and determining a second set of minimum-volume bounding boxes that is tangent to the cutting plane and encloses the second portion of the 3D model. In addition, the functions include determining a preform geometry for the part. The preform geometry includes the first set of minimum-volume bounding boxes and the second set of minimum-volume bounding boxes.

In another example, another computer-implemented method is provided. The method includes receiving, via a GUI, a 3D model of a part, and receiving, via the GUI, data defining at least one cutting plane. The at least one cutting plane intersects the 3D model of the part. The method also includes generating, based on the at least one cutting plane, a preform geometry for the part. Further, the method includes determining a maximum welding surface area of a plurality of individual welding surface areas associated with fabricating a LFW preform having the preform geometry. Still further, the method includes displaying a visual representation of the preform geometry and the maximum welding surface area.

The features, functions, and advantages that have been discussed can be achieved independently in various examples or may be combined in yet other examples further details of which can be seen with reference to the following description and figures.

BRIEF DESCRIPTION OF THE FIGURES

The novel features believed characteristic of the illustrative examples are set forth in the appended claims. The illustrative examples, however, as well as a preferred mode of use, further objectives and descriptions thereof, will best be understood by reference to the following detailed description of an illustrative example of the present disclosure when read in conjunction with the accompanying figures, wherein:

DETAILED DESCRIPTION

Disclosed examples will now be described more fully hereinafter with reference to the accompanying figures, in which some, but not all of the disclosed examples are shown. Indeed, several different examples may be provided and should not be construed as limited to the examples set forth herein. Rather, these examples are provided so that this disclosure will be thorough and complete and will fully convey the scope of the disclosure to those skilled in the art.

Within examples, systems and methods for designing a preform geometry using an interactive GUI are described. For instance, the interactive GUI may allow an operator to input data defining one or more cutting planes that intersect and divide a 3D model of a part into different portions, and then view and analyze a preform geometry that is automatically generated by a computing device based on the input data. The computing device may also determine and output at least one fabrication value corresponding to a fabrication of a preform having the preform geometry. For instance, the at least one fabrication value may be a total volume of the preform geometry or a maximum welding surface area.

Further, the interactive GUI may allow an operator to modify the preform geometry by, for example, deleting cutting planes, adding additional cutting planes, or modifying the orientation or position of existing cutting planes. After receiving data defining a modification to the preform geometry, the computing device may determine and output an updated preform geometry.

Advantageously, the systems and methods allow an operator to rapidly design, analyze, and revise a preform geometry, resulting in significant time savings. For instance, in a matter of minutes, an operator can input a 3D model of a part, define one or more cutting planes, view a resulting preform geometry, and analyze the cost or feasibility of fabricating a preform having the preform geometry.

Various other features of the systems and methods are also described hereinafter with reference to the accompanying figures.

Figure 1:
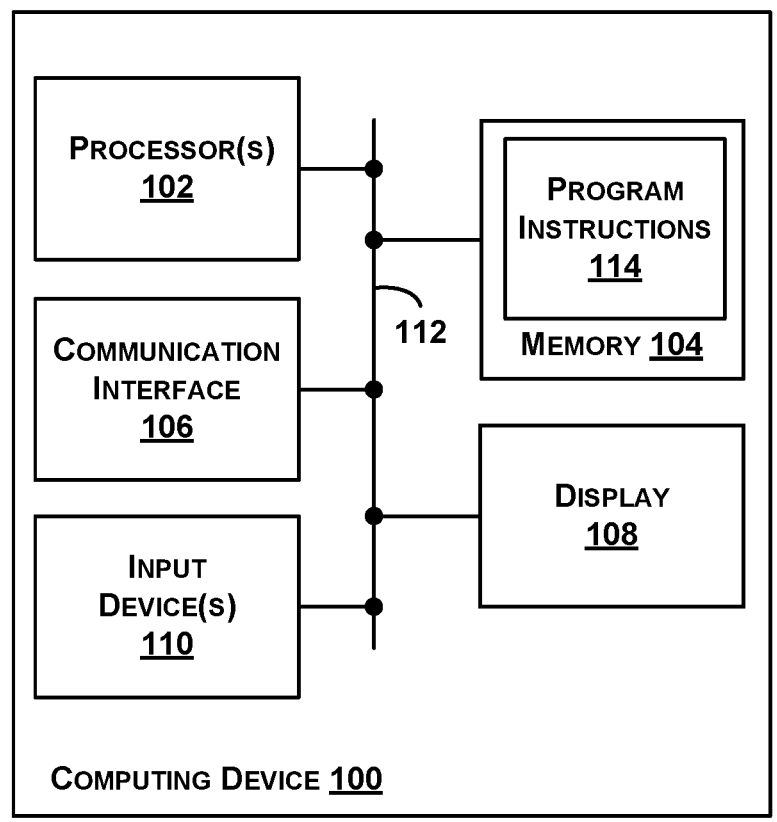
FIG. 1 illustrates an example computing device, according to an example embodiment.

Referring now to FIG. 1, an example computing device 100 is illustrated. In some examples, components illustrated in FIG. 1 may be distributed across multiple computing devices. However, for the sake of example, the components are shown and described as part of one example computing device 100. The computing device 100 may be or include a mobile device (such as a mobile phone), desktop computer, laptop computer, tablet computer, or similar device that may be configured to perform the functions described herein.

As shown in FIG. 1, the computing device 100 may include one or more processors 102, a memory 104, a communication interface 106, a display 108, and one or more input devices 110. Components illustrated in FIG. 1 may be linked together by a system bus, network, or other connection mechanism 112. The computing device 100 may also include hardware to enable communication within the computing device 100 and between the computing device 100 and one or more other devices. The hardware may include transmitters, receivers, and antennas, for example.

The one or more processors 102 may be any type of processor, such as a microprocessor, digital signal processor, multicore processor, etc., coupled to the memory 104. The memory 104 may be any type of memory, such as volatile memory like random access memory (RAM), dynamic random access memory (DRAM), static random access memory (SRAM), or non-volatile memory like read-only memory (ROM), flash memory, magnetic or optical disks, or compact-disc read-only memory (CD-ROM), among other devices used to store data or programs on a temporary or permanent basis.

Additionally, the memory 104 may be configured to store program instructions 114. The program instructions 114 may be executable by the one or more processors 102 to cause the computing device 100 to perform one or more functions. For instance, the program instructions 114 may be executable to cause the computing device 100 to provide a GUI, receive a 3D model of a part, receive data defining a cutting plane, and determine a preform geometry for the part. The program instructions 114 may also be executable to cause the one or more processors 102 to perform other functions, such as any of the functions described herein.

The communication interface 106 may be configured to facilitate communication with one or more other devices, in accordance with one or more wired or wireless communication protocols. For example, the communication interface 106 may be configured to facilitate wireless data communication for the computing device 100 according to one or more wireless communication standards, such as one or more IEEE 801.11 standards, ZigBee standards, Bluetooth standards, etc. As another example, the communication interface 106 may be configured to facilitate wired data communication with one or more other devices.

The display 108 may be any type of display component configured to display data. As one example, the display 108 may include a touchscreen display. As another example, the display may include a flat-panel display, such as a liquid-crystal display (LCD) or a light-emitting diode (LED) display.

The one or more input devices 110 may include one or more pieces of hardware equipment used to provide data and control signals to the computing device 100. For instance, the one or more input devices 110 may include a mouse or pointing device, a keyboard or keypad, a microphone, a touchpad, or a touchscreen, among other possible types of input devices. Generally, the one or more input devices 110 may allow an operator to interact with a GUI provided by the computing device 100.

To help illustrate features of the present disclosure, portions of the remainder of this document will focus on a GUI for designing an LFW preform geometry. Those of ordinary skill in the art will readily appreciate, however, that the disclosed principles can be applied as well to other types of preform geometries, with variations where appropriate.

Figure 2:
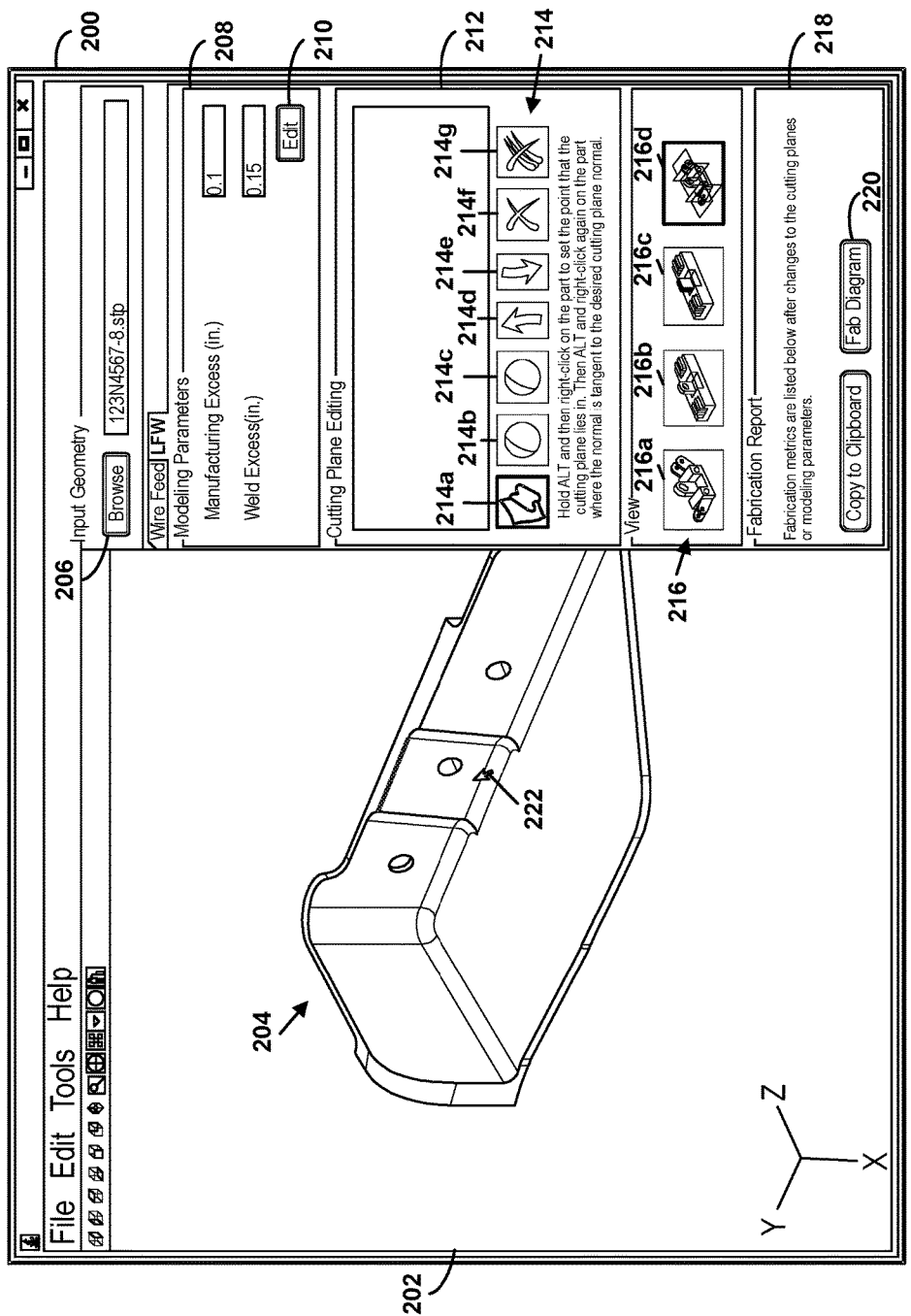
FIG. 2 illustrates features of an example GUI, according to an example embodiment.

FIG. 2 illustrates features of an example GUI 200. In particular, FIG. 2 illustrates features of an example GUI 200 for designing an LFW preform geometry. The GUI may be provided on a display of a computing device, such as the computing device 100 of FIG. 1.

As shown, in FIG. 2, the GUI 200 includes a display window 202 for displaying a 3D model 204 of a part. The display window 202 may be an interactive 3D model viewer. A user may pan or rotate the 3D model 204 within the display window 202. A user may also zoom in or zoom out on the 3D model within the display window 202.

Further, the GUI 200 includes various icons for interacting with the 3D model 204. For instance, the GUI 200 includes an input-geometry icon 206 which a user may click or otherwise activate to input the 3D model 204.

The GUI 200 also includes a modeling-parameters window 208 and an edit-parameters icon 210 for editing the modeling parameters. The modeling-parameters window 208 displays the value of various modeling parameters which are used to generate a preform geometry. As shown in FIG. 2, the modeling-parameters window 208 indicates that the manufacturing excess is currently set to 0.1 inches and the weld excess is currently set to 0.15 inches.

The manufacturing excess quantifies how much the preform geometry is expanded to account for excess material that is lost when a part is manufactured from a preform having the preform geometry. The manufacturing excess may, for instance, enable a manufacture to smooth or otherwise clean up the surfaces of a preform. The weld excess quantifies how much the preform geometry is expanded at welding interfaces to account for material that is lost when blocks are welded together. A user may click or otherwise activate the edit-parameters icon 210 to edit the modeling parameters.

The GUI 200 also includes a cutting-plane-editing window 212 and various cutting-plane-editing icons 214. The cutting-plane-editing window 212 displays the current cutting planes. A user may click or otherwise activate the cutting-plane-editing icons 214 to add, delete, or modify a cutting plane, or modify the ordering of cutting planes.

Specifically, a user may click or otherwise activate the add-plane icon 214a to add a cutting plane, click or otherwise activate the in-plane-point icon 214b to modify the position of a cutting plane, and click or otherwise activate the normal-defining-point icon 214c to modify the orientation of a cutting plane. Further, a user may click or otherwise activate the up icon 214d to move a cutting plane up and click or otherwise activate the down icon 214e to move a cutting plane down. As described more fully below, the ordering of the cutting planes corresponds to an order in which to combine sections of material to create a preform. Still further, a user may click or otherwise activate the delete-cutting-plane icon 214f to delete a single cutting plane and click or otherwise activate the delete-all-cutting-planes icon 214g to delete all cutting planes.

As discussed below, the cutting-plane editing icons 214 are either active or inactive depending on which view the GUI 200 is in and whether a cutting plane has been defined. In FIG. 2, for instance, the add-plane icon 214a is active since the GUI is in a cutting-plane editing view. For purposes of example, the border of the add-plane icon 214a is highlighted (e.g. bolded), indicating that the add-plane icon 214a is active. The other cutting-plane editing icons 214 are inactive since there are not any defined cutting planes yet. Hence, the borders of the other cutting-plane editing icons are not highlighted indicating that the other cutting-plane editing icons 214 are inactive.

The GUI also includes various view icons 216. A user may click or otherwise activate the view icons 216 to change the view displayed in the display window 202. Specifically, a user may click or otherwise activate the part-view icon 216a to view the 3D model of the part without any cutting planes or preform geometry, click or otherwise activate the pre-excess-preform-view icon 216b to view the preform geometry before manufacturing excess and weld excesses are applied, click or otherwise activate the post-excess-view icon 216c to view the preform geometry after manufacturing excess and weld excess are applied, and click or otherwise activate the edit-view icon 216d to view and edit the cutting plane(s). The preform geometry and/or cutting planes may be displayed by overlaying the 3D model 204 of the part. The preform geometry and/or cutting planes may be at least partially transparent. Whenever a user clicks on the part-view icon 216a, the pre-excess-preform view icon 216b, or the post-excess-view icon 216c to view the part, pre-excess-preform, or post-excess preform, respectively, all of the cutting-plane editing icons 214 become inactive.

In FIG. 2, the border of the edit-view icon 216d is highlighted (e.g., bolded), indicating that a user can view and edit the cutting planes.

The GUI also includes a fabrication window 218 and a fabrication-diagram icon 220. The fabrication window displays fabrication values corresponding to a fabrication of a preform having the preform geometry. A user may click or otherwise activate the fabrication-diagram icon 220 to view a fabrication diagram. As described more fully below, the fabrication diagram may specify an order in which to combine sections of material to create the preform. The fabrication diagram may also specify dimensions and/or volumes of the individual sections, and fabrication values corresponding to joining the sections.

In some examples, a user may use the GUI 200 to define a cutting plane. By way of example, a user may click on the add-plane icon 214a to indicate a request to define a cutting plane. The process may involve specifying an in-plane point and a normal point on the 3D model. The in-plane point is a point on the 3D model that lies in the cutting plane. The normal point is a point on the 3D model having a normal that is equal to a normal of the cutting plane. In other examples, a user may define a cutting plane using other techniques. For instance, a user may click on three in-plane points on the 3D model. Alternatively, a user may input a numeric definition of the cutting plane. Further, the GUI 200 may provide one or more interactive sliders that a user may utilize to modify the definition of a cutting plane. For instance, the GUI 200 may include one or more interactive sliders which a user may slide to translate a cutting plane. Similarly, the GUI 200 may include one or more interactive sliders which a user may slide to rotate a cutting plane.

As shown in FIG. 2, to define a cutting plane that chops off the bottom of the part 204, a user may use a pointer 222 to select a point on the 3D model as the in-plane point for the cutting plane.

Figure 3:
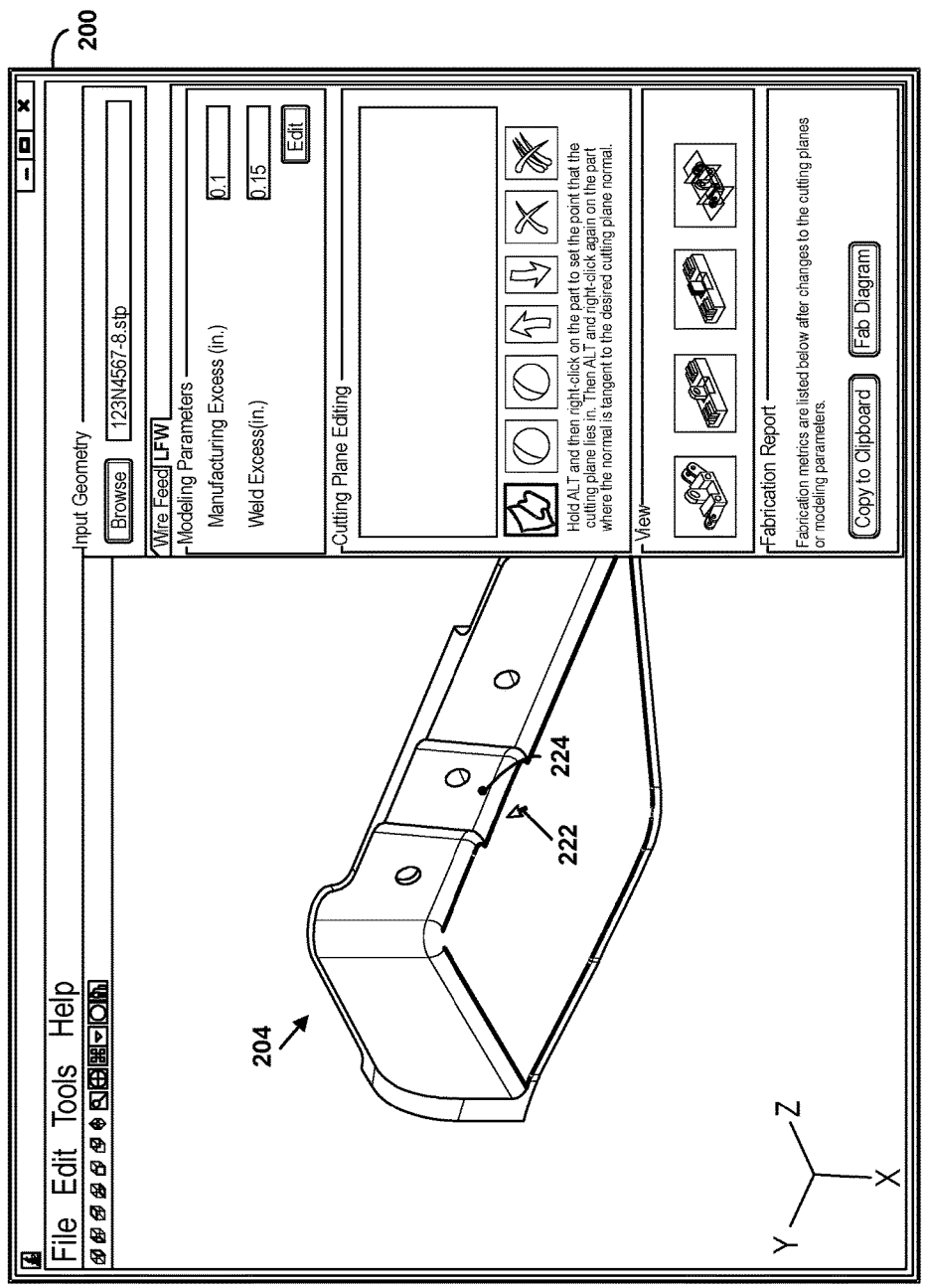
FIG. 3 illustrates additional features of the example GUI, according to an example embodiment.

As shown in FIG. 3, after a user selects an in-plane point, the GUI 200 may display an in-plane-point indicator 224 on the 3D model. A user may also use the pointer 222 to select a normal point on the 3D model. For instance, a user may select a point on a bottom portion of the part 204.

Based on the selected in-plane point and normal point, the computing device may then determine a cutting plane that includes the in-plane point and has the same normal as the normal of the 3D model where the normal point is defined. By way of example, the computing device may determine the three-dimensional coordinates of the in-plane point and the normal point, and use the three-dimensional coordinates to calculate the position and orientation (i.e., normal) of the cutting plane.

Figure 4:
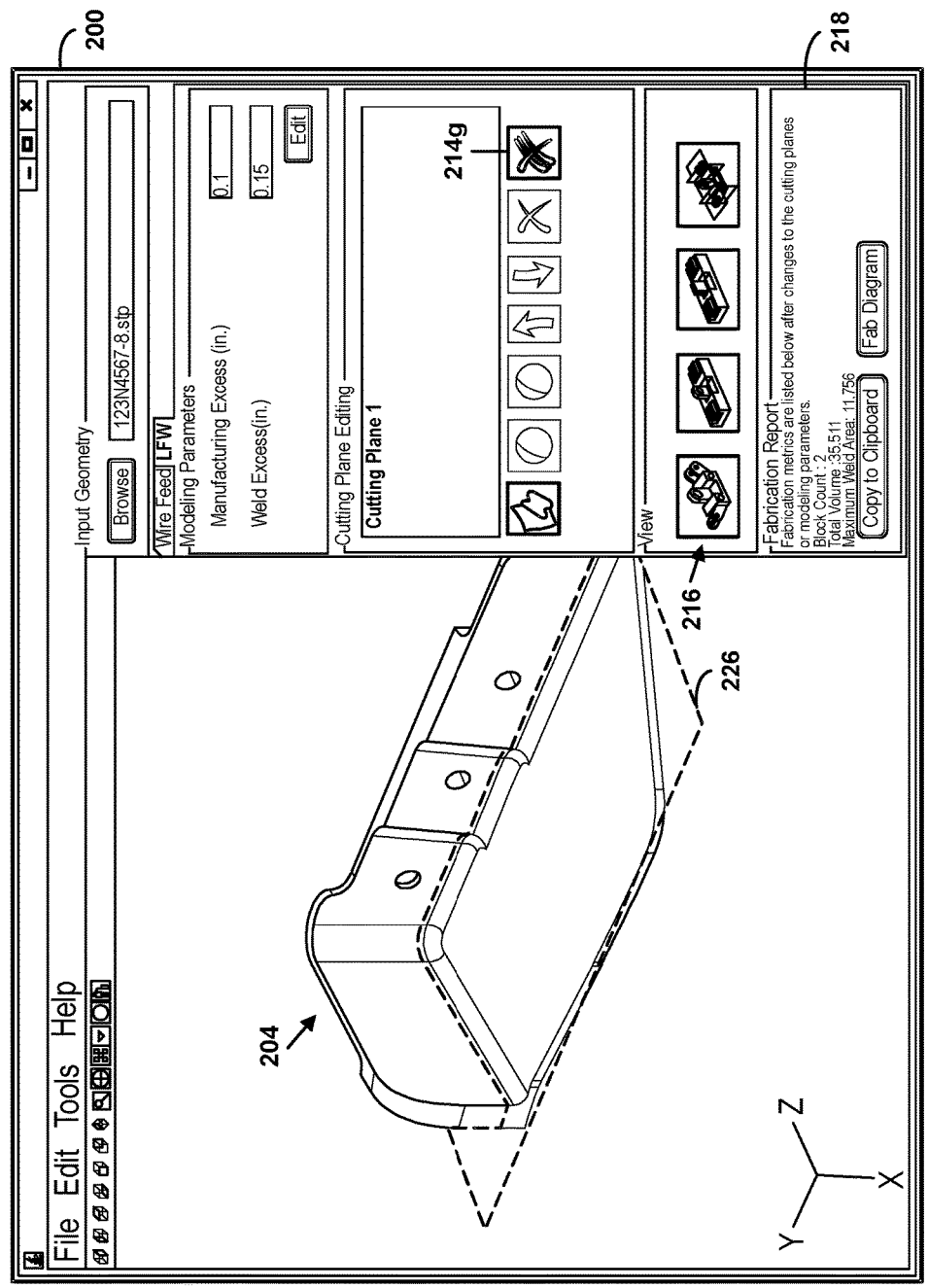
FIG. 4 illustrates additional features of the example GUI, according to an example embodiment.

As shown in FIG. 4, after a user defines a cutting plane, the GUI 200 may provide a visual representation 226 of the cutting plane determined by the computing device. The visual representation 226 of the cutting plane may overlay the 3D model 204. The visual representation 226 depicted in FIG. 4 indicates that the cutting plane separates the 3D model 204 into two portions: a first portion located on a first side of the cutting plane and a second portion located on an opposite side of the cutting plane. In some instances the visual representation of the cutting plane may be partially transparent. Depending on the geometry of the part and the orientation and position of the cutting plane, the first portion and/or the second portion may include either a single connected subset of geometry or multiple connected subsets of geometry. In FIG. 4, the first portion and the second portion each include a single connected subset of geometry. On the other hand, in FIG. 15 discussed more fully below, the first portion includes three connected subsets of geometry and the second portion includes a single connected subset of geometry.

In FIG. 4, the border of the delete-all-cutting-planes icon 214g is highlighted, indicating that the delete-all-cutting planes icon 214g is active and a user may utilize the delete-all-cutting planes icon 214g to delete all cutting planes. In FIG. 4, the borders of all of the view icons 216 are highlighted, indicating that all the view icons 216 are active and a user may utilize the view icons 216 to change the view.

After a user defines a cutting plane, the computing device may also determine a preform geometry corresponding to the cutting plane. Determining the preform geometry may involve determining a first set of minimum-volume bounding boxes that is tangent to the cutting plane and encloses the first portion and determining a second set of minimum-volume bounding boxes that is tangent to the cutting plane and encloses the second portion of the 3D model 204.

A minimum-volume bounding box for a point set is a box with the smallest volume within which all the points lie. In the context of a the 3D model of a part, a minimum-volume bounding box is the box with the smallest volume within which all the points of a connected subset of geometry of the 3D model lie, subject to the additional constraint that one side of the box is tangent to the cutting plane. Depending on the number of connected subsets of geometry in the first portion and the second portion, the first set of minimum-volume bounding boxes and the second set of minimum-volume bounding boxes, respectively, may include one or more than one minimum-volume bounding boxes.

By way of example, the example cutting plane depicted in FIG. 4 divides the 3D model 204 into a first portion having a single connected subset of geometry and a second portion having a single connected subset of geometry. Hence, the first set of minimum-volume bounding boxes includes a single minimum-volume bounding box and the second set of minimum-volume bounding boxes also includes a single minimum-volume bounding box. Specifically, for the 3D model 204, the first set of minimum-volume bounding boxes includes a first minimum-volume bounding box and the second set of minimum-volume bounding box includes a second minimum-volume bounding box. The preform geometry corresponding to the cutting plane is therefore the combination of the first minimum-volume bounding box and the second minimum-volume bounding box as the two bounding boxes are arranged in three-dimensional space.

As noted above, in other examples, the first set of minimum-volume bounding boxes and/or the second set of minimum-volume bounding boxes may include multiple minimum-volume bounding boxes. Thus, more generally, the preform geometry corresponding to a cutting plane is the combination of a first set of minimum-volume bounding boxes and a second set of minimum-volume bounding boxes as the two sets of bounding boxes are arranged in three-dimensional space.

Referring back to FIG. 4, the computing device may also determine one or more fabrication values corresponding to fabrication of a preform having the determined preform geometry. For instance, the computing device may determine a block count, total volume, and maximum welding surface area. As shown in FIG. 4, the computing device may display the determined fabrication values in the fabrication window 218. In the illustration depicted in FIG. 4, the block count is two since the preform geometry is made up of two minimum-volume bounding boxes. To fabricate a preform having the preform geometry, a first block of raw material that is the size of the first minimum-volume bounding box may be welded to a second block of raw material that is the size of the second minimum-volume bounding box.

Further, in the illustration depicted in FIG. 4, the total volume of the minimum-volume bounding boxes is 35.511 cubic inches. The computing device may determine the total volume by summing the volume of the first set of minimum-volume bounding boxes and the second set of minimum-volume bounding boxes. Displaying the total volume may allow the user to quickly discern the amount of raw material required to manufacture a preform having the preform geometry.

In the illustration depicted in FIG. 4, the maximum welding surface area is 11.756 square inches. For the 3D model 204, the computing device may determine the maximum welding surface area by calculating the area of the intersection of the first minimum-volume bounding box, the second minimum-volume bounding box, and the cutting plane. Displaying the maximum welding surface area may allow the user to quickly discern whether it is feasible to fabricate a preform having the preform geometry. For instance, the user can determine whether the maximum welding surface area is larger than a maximum feasible welding surface area for LFW.

Figure 5:
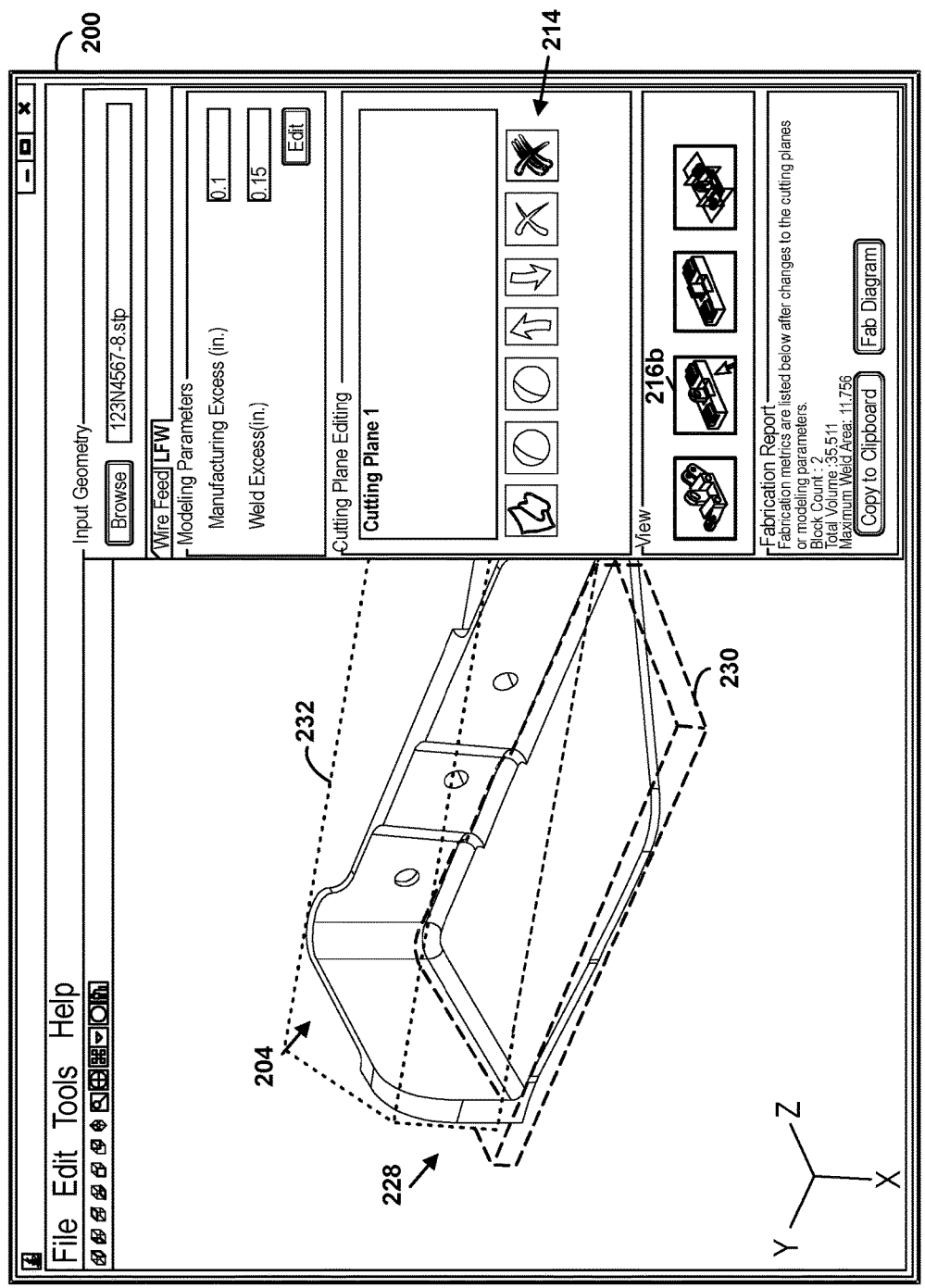
FIG. 5 illustrates additional features of the example GUI, according to an example embodiment.

FIG. 5 illustrates a pre-excess view of the preform geometry determined by the computing device. As discussed above, in response to a user clicking on the pre-excess-view icon 216b, the GUI may display a visual representation 228 of the preform geometry. The visual representation 228 of the preform geometry may overlay the 3D model 204 of the part. In some instances, the visual representation 228 may be at least partially transparent. The visual representation 228 may include a first depiction 230 of the first set of minimum-volume bounding boxes and a second depiction 232 of the second set of minimum-volume bounding boxes. In FIG. 5, all of the cutting-plane editing icons 214 are inactive since the GUI is in the pre-excess view. Hence, none of the borders of the cutting-plane editing icons 214 are highlighted.

Figure 6:
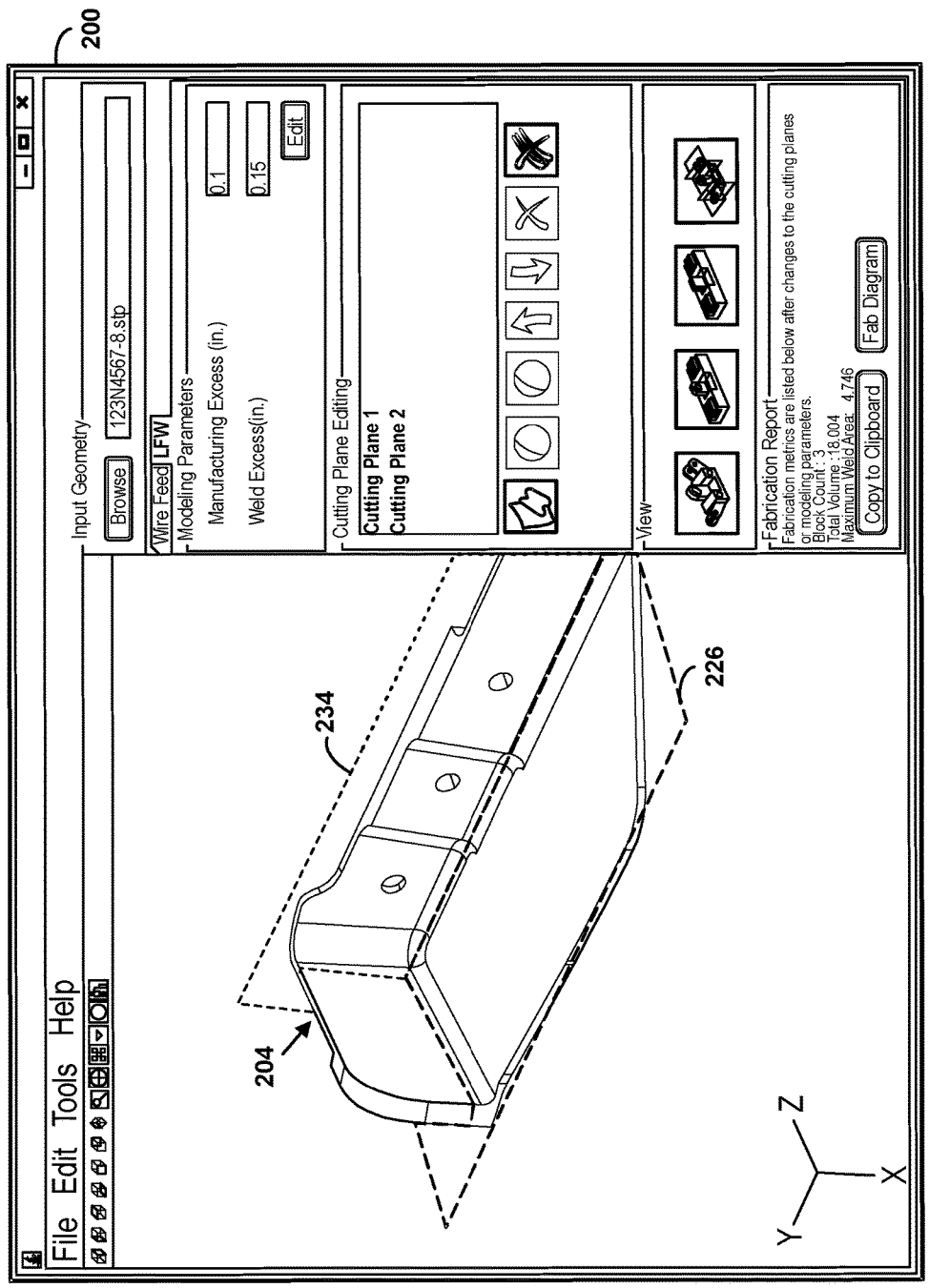
FIG. 6 illustrates additional features of the example GUI, according to an example embodiment.

In some examples, a user may add, via the GUI 200, an additional cutting plane which divides either the first portion or the second portion of the 3D model 204 into a first sub-portion and a second sub-portion. By way of example, as shown in FIG. 6, a user may add a second cutting plane that divides the second portion into a first sub-portion and a second sub-portion. After a user adds the second cutting plane, the GUI 200 may display a visual representation 234 of the second cutting plane.

In addition, after the user adds the second cutting plane, the computing device may determine an updated preform geometry. Determining the updated geometry may involve determining a third set of minimum-volume bounding boxes that is tangent to the second cutting plane and encloses the first sub-portion of the 3D model 204 and determining a fourth set of minimum-volume bounding box that is tangent to the second cutting plane and encloses the second sub-portion of the 3D model 204. In this case, the first sub-portion and the second sub-portion each include a single connected subset of geometry. Hence, the third set of minimum-volume bounding boxes and the fourth set of minimum-volume bounding boxes each include a single minimum-volume bounding box, which are hereinafter referred to as a third minimum-volume bounding box and a fourth minimum-volume bounding box. In other examples, the third set of minimum-volume bounding boxes and/or the fourth set of minimum-volume bounding boxes may include multiple minimum volume bounding boxes. The second set of minimum-volume bounding boxes is then disregarded, since the second portion was divided. The preform geometry corresponding to the first cutting plane and the second cutting plane is the combination of the first minimum-volume bounding box, the third minimum-volume bounding box, and the fourth minimum-volume bounding box as the bounding boxes are arranged in three-dimensional space.

The computing device may also determine updated fabrication values corresponding to fabrication of a preform having the updated preform geometry, and display the updated fabrication values in the fabrication window 218. In the illustration depicted in FIG. 6, the block count is three since the preform geometry is made up of three minimum-volume bounding boxes. To fabricate a preform having the preform geometry, a first block of raw material that is the size of the third minimum-volume bounding box may be welded to a second block of raw material that is the size of the fourth minimum-volume bounding box. The combination of the first block and the second block may then be welded to a third block of raw material that is the size of the first minimum-volume bounding box.

Further, in the illustration depicted in FIG. 6, the total volume is 18.004 cubic inches. The computing device may determine the total volume by summing the volume of the first minimum-volume bounding box, the third minimum-volume bounding box, and the fourth minimum-volume bounding box.

In the illustration depicted in FIG. 6, the maximum welding surface area is 4.746 square inches. The computing device may determine the maximum welding surface area by determining the welding surface area of the weld between the third minimum-volume bounding box and the fourth minimum-volume bounding box, determining the welding surface area of the weld between the first minimum-volume bounding box and the combination of the third minimum-volume bounding box and the fourth minimum-volume bounding box, and selecting the maximum welding surface area of the two determined welding surface areas. The computing device may determine the welding surface area between the third minimum-volume bounding box and the fourth minimum-volume bounding box by calculating the area of the intersection between the third minimum-volume bounding box, the fourth minimum-volume bounding box, and the second cutting plane. The computing device may determine the welding surface area between the first minimum-volume bounding box and the combination of the third-minimum volume bounding box and the fourth minimum-volume bounding box by calculating the area of the intersection between the first minimum-volume bounding box, the first cutting plane, and the combination of the third-minimum volume bounding box and fourth minimum-volume bounding box.

Figure 7:
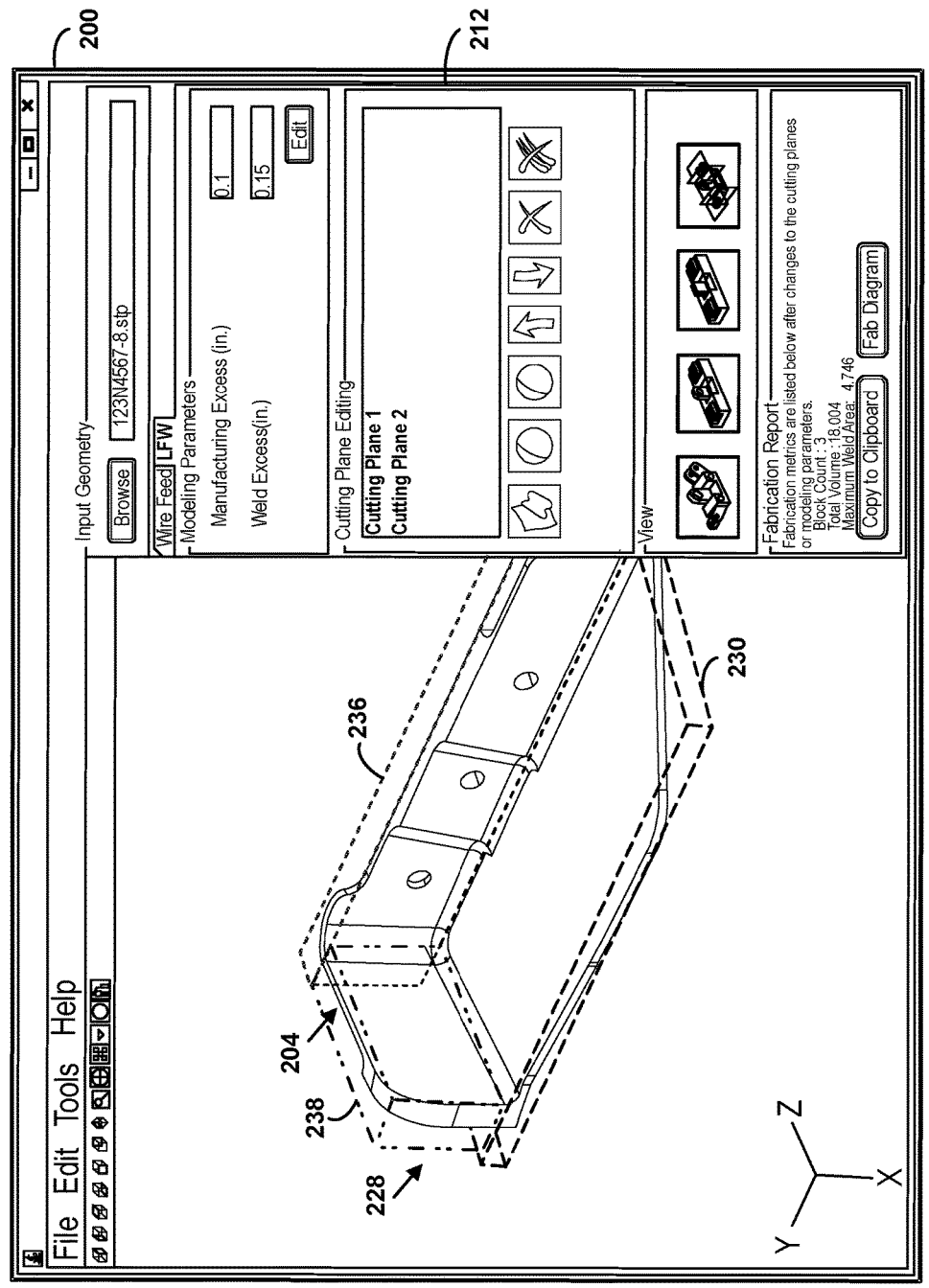
FIG. 7 illustrates additional features of the example GUI, according to an example embodiment.

FIG. 7 illustrates a pre-excess view of the updated preform geometry determined by the computing device. As discussed above, in response to a user clicking on the pre-excess-view icon 216b, the GUI may display a visual representation 228 of the preform geometry. The visual representation 228 of the preform geometry may overlay the 3D model 204 of the part. The visual representation 228 shown in FIG. 7 includes the first depiction 230 of the first minimum-volume bounding box as well as a third depiction 236 of the third minimum-volume bounding box and a fourth depiction 238 of the fourth minimum-volume bounding box.

Figure 8:
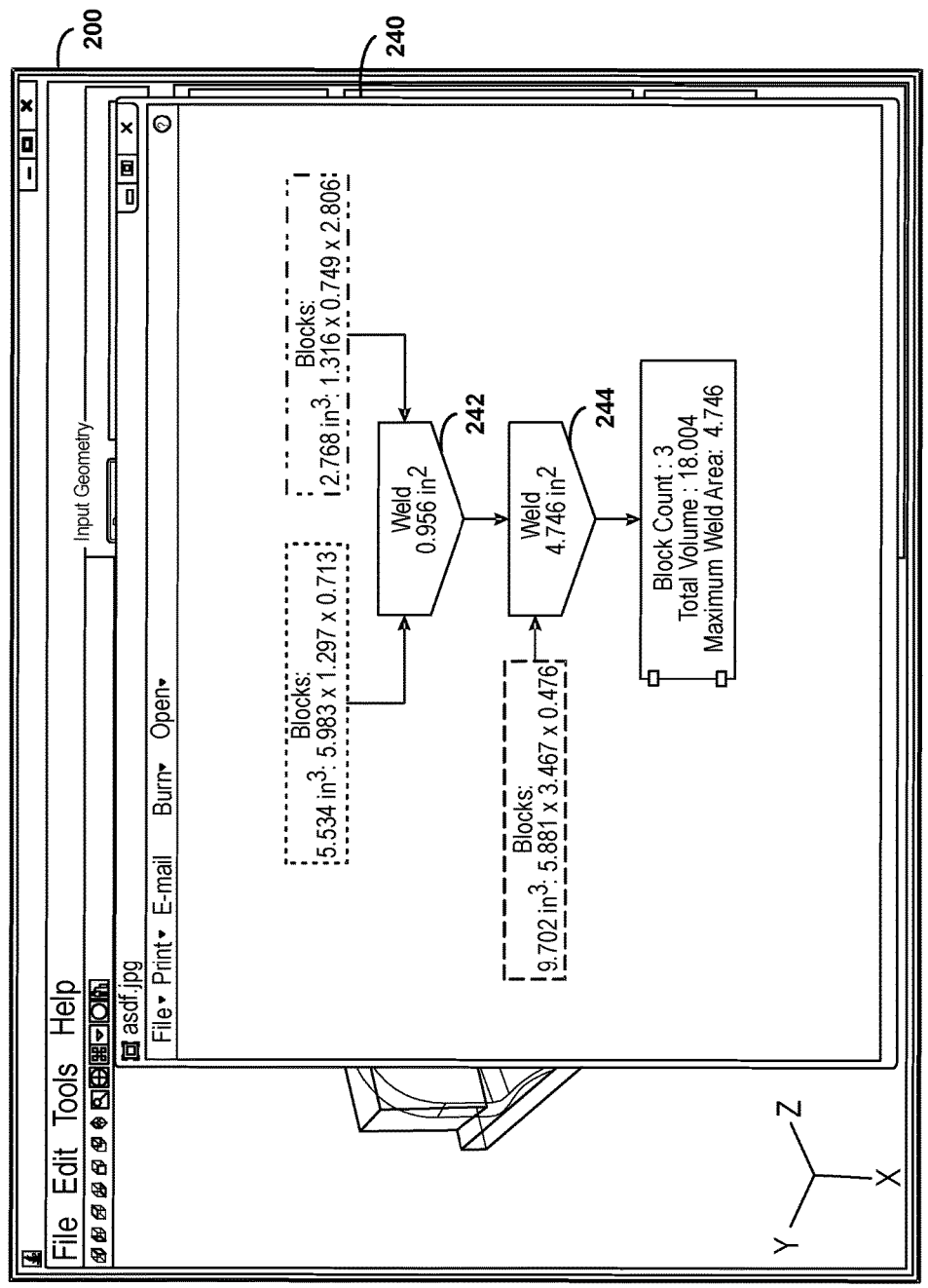
FIG. 8 illustrates additional features of the example GUI, according to an example embodiment.

FIG. 8 illustrates a fabrication diagram 240 corresponding to fabrication of a preform having the preform geometry determined by the computing device. The fabrication diagram 240 shows an order in which to combine sections of material to create a preform having the preform geometry. The order in which to combine the sections corresponds to the order of the cutting planes indicated in the cutting-plane-editing window 212 of FIG. 7. Specifically, since the second cutting plane is listed last in the cutting-plane-editing window 212, the fabrication diagram 240 indicates that first and second blocks having the dimensions of the third minimum-volume bounding box and fourth minimum-volume bounding box, respectively, which were defined by the second cutting plane, are welded together at a first step 242. Subsequently, the welded combination of the first and second blocks is welded to a third block having the dimensions of the first minimum-volume bounding box at a second step 244.

The fabrication diagram 240 shows the welding surface area of each of the welds at the first step 242 and second step 244. This information may be useful to the user so that the user can figure out how to revise or modify the cutting planes. For instance, the information may indicate which of the two welds has the maximum welding surface area. The fabrication diagram also shows the dimensions of each of the blocks. This information may be useful to the user so that the user can evaluate what size of stock material the blocks can be formed from. In some instances, the fabrication diagram may show the volume of each of the blocks (not shown).

A user may export, save, download, print, or email a copy of the fabrication diagram 240 via the GUI 200.

Figure 9:
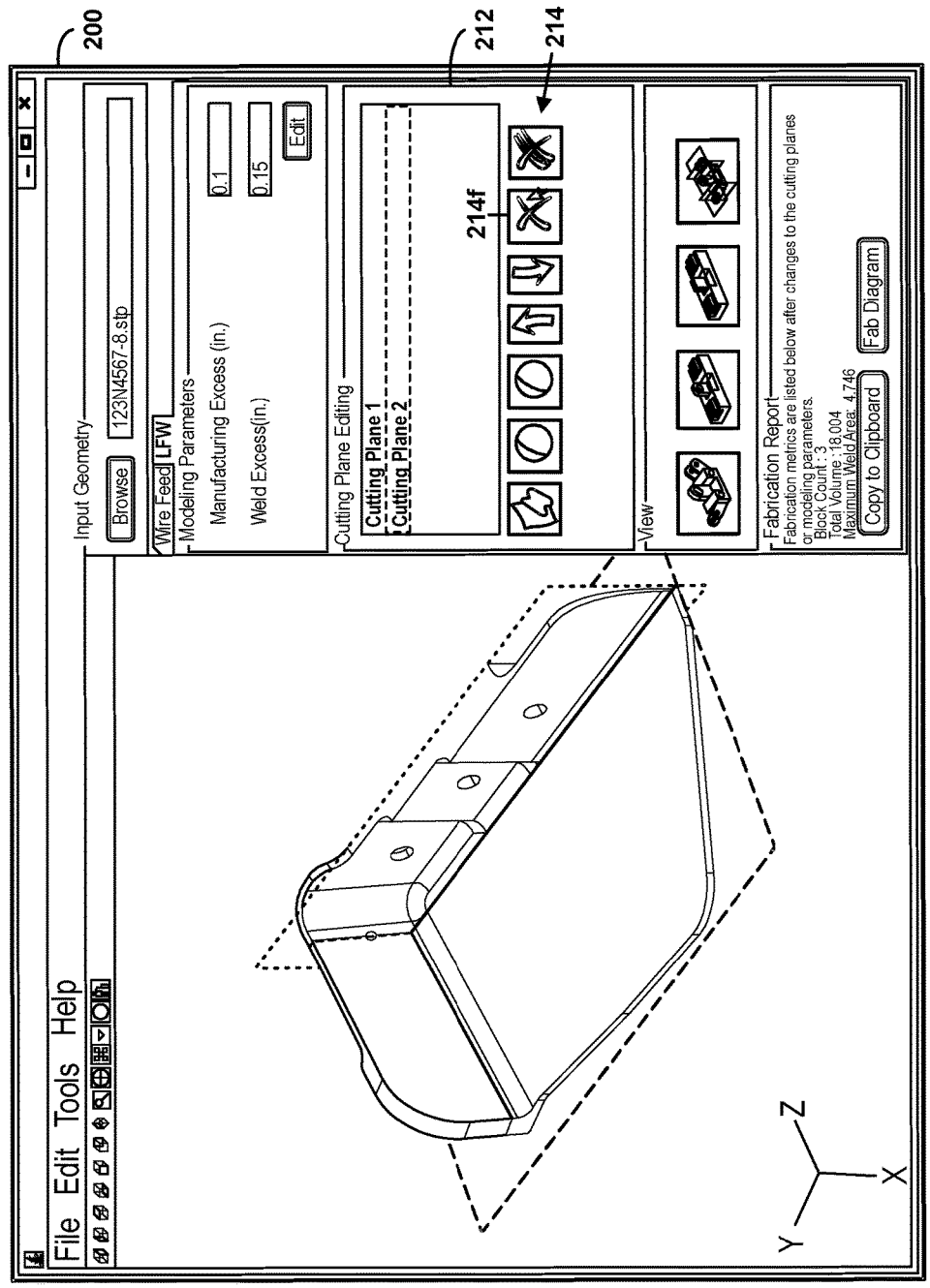
FIG. 9 illustrates additional features of the example GUI, according to an example embodiment.

FIG. 9 illustrates the manner in which a user may delete a cutting plane via the GUI 200. In particular, as shown in FIG. 9, a user may click on a particular cutting plane (i.e. "Cutting Plane 2") listed in the cutting-plane-editing window 212. In some examples, after receiving a selection of a particular cutting plane, the computing device may highlight, darken, or otherwise emphasize the displayed visual representation of the cutting plane (not shown). After selecting the particular cutting plane, the borders of all of the cutting-plane editing icons 214 are highlighted, indicating that all of the cutting-plane editing icons 214 are active. Accordingly, the user may click on the delete-cutting-plane icon 214f to delete the particular cutting plane.

Figure 10:
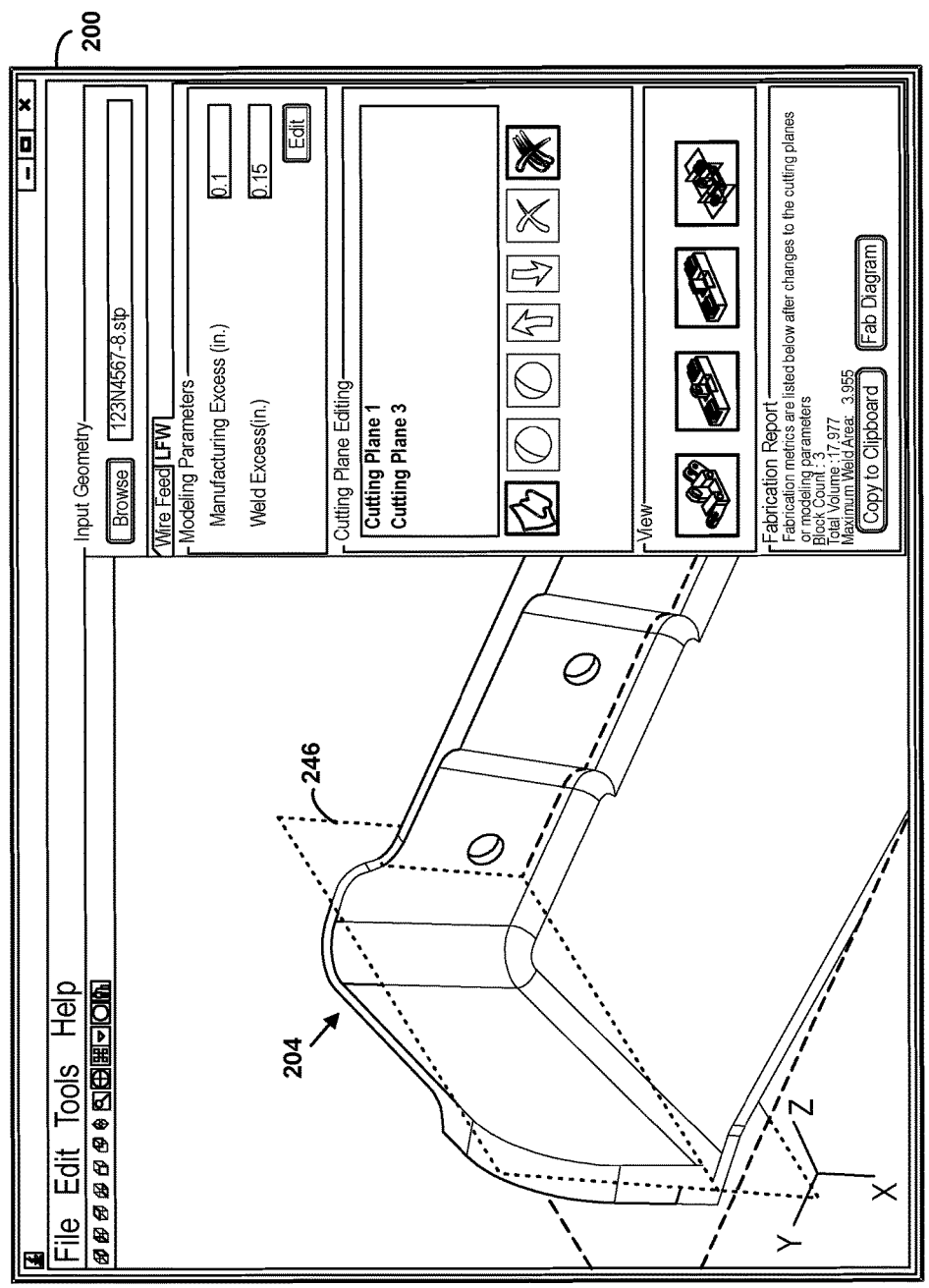
FIG. 10 illustrates additional features of the example GUI, according to an example embodiment.

In FIG. 10, a third cutting plane has been added in place of the second cutting plane. The GUI 200 provides a visual representation 246 of the third cutting plane. In this case, the third cutting plane divides the second portion of the 3D model 204 into a third sub-portion and a fourth sub-portion.

In line with the discussion above, after the user adds the third cutting plane, the computing device may determine an updated preform geometry. As further discussed above, the computing device may also determine updated fabrication values corresponding to fabrication of a preform having the updated preform geometry, and display the updated fabrication values in the fabrication window 218. In the illustration depicted in FIG. 10, the block count is three, the total volume is 17.977 inches, and the maximum welding surface area is 3.955 square inches.

Figure 11:
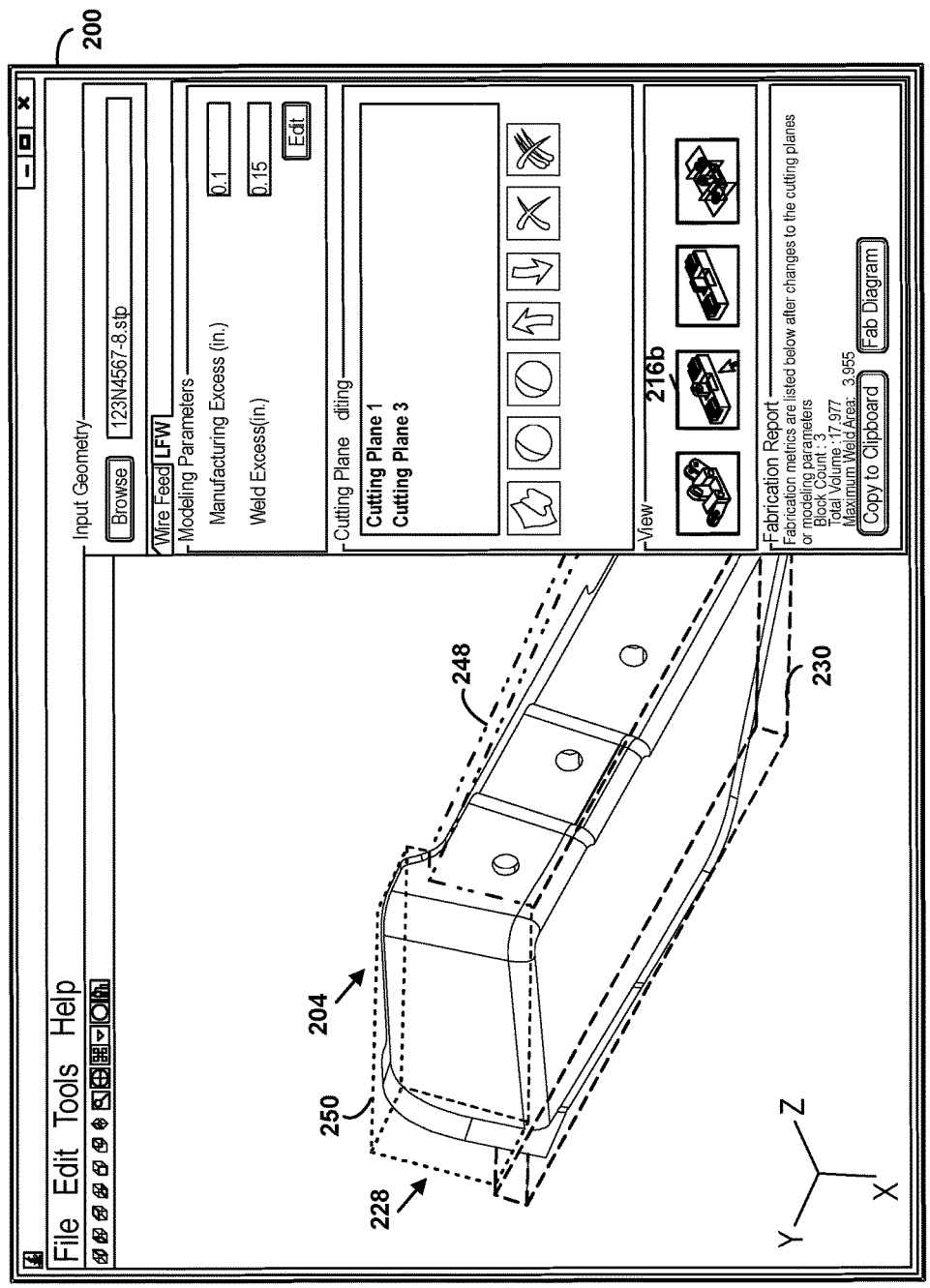
FIG. 11 illustrates additional features of the example GUI, according to an example embodiment.

FIG. 11 illustrates a pre-excess view of the updated preform geometry determined by the computing device after the addition of the third cutting plane. As discussed above, in response to a user clicking on the pre-excess-view icon 216b, the GUI may display a visual representation 228 of the preform geometry. The visual representation 228 of the preform geometry may overlay the 3D model 204 of the part. The visual representation 228 shown in FIG. 11 includes the first depiction 230 of the first set of minimum-volume bounding boxes as well as a fifth depiction 248 of a fifth set of minimum-volume bounding boxes and a sixth depiction 250 of a sixth set of minimum-volume bounding boxes. The fifth set of minimum-volume bounding boxes includes a single fifth minimum-volume bounding box, and the sixth set of minimum-volume bounding boxes includes a single sixth minimum-volume bounding box.

Figure 12:
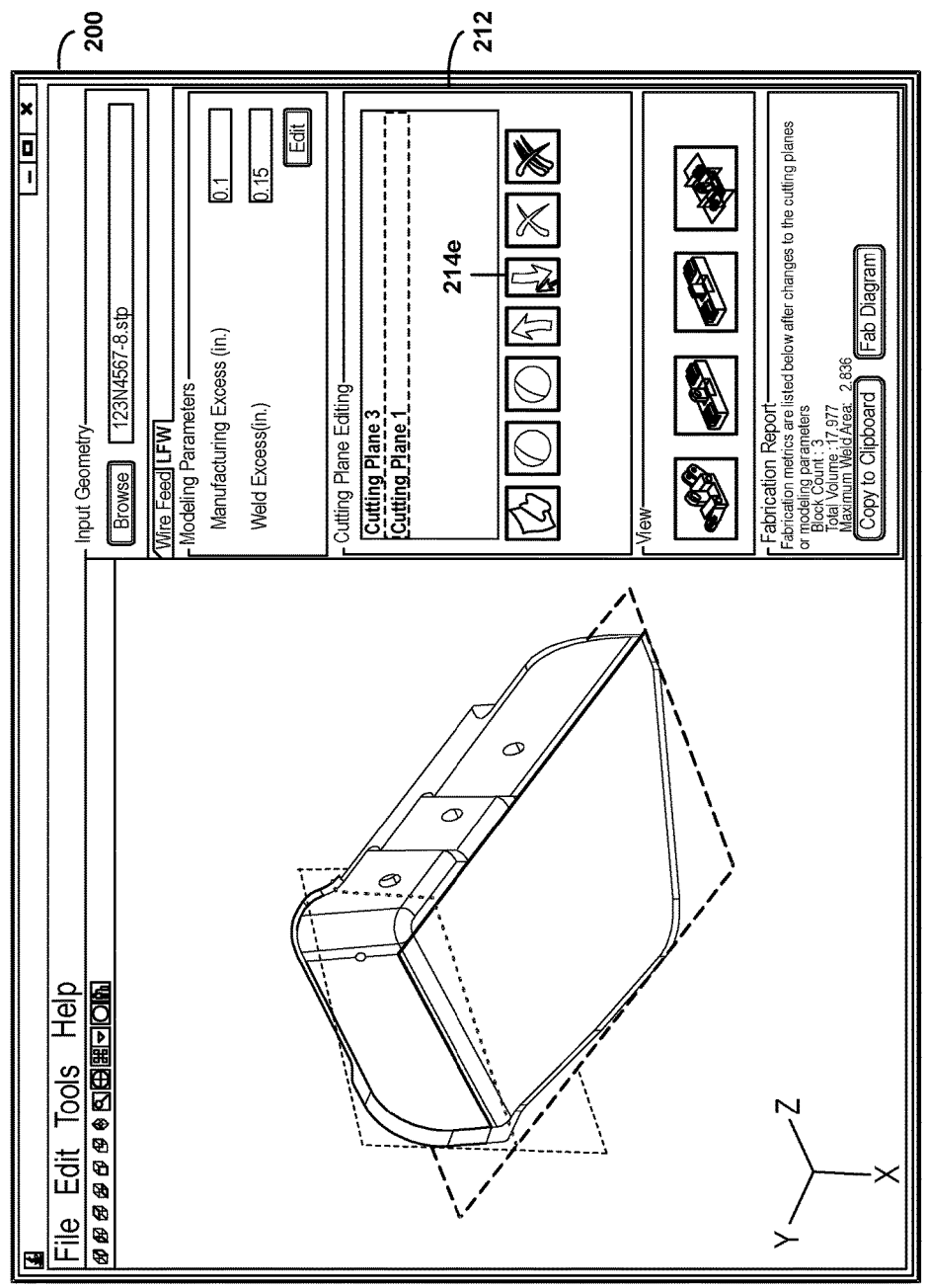
FIG. 12 illustrates additional features of the example GUI, according to an example embodiment.

FIG. 12 illustrates the manner in which a user may adjust the order of cutting planes via the GUI 200. In particular, as shown in FIG. 12, a user may click on a particular cutting plane (i.e. "Cutting Plane 1") listed in the cutting-plane-editing window 212. After selecting the particular cutting plane, the user may click on the down icon 214e to move the cutting plane down in the list of cutting planes. Moving the cutting plane down in the list of cutting planes affects the order in which sections of material are combined to form a preform having the preform geometry. Hence, after the user moves the cutting plane down, the computing device updates the preform geometry and updates the fabrication values. As shown in FIG. 12, swapping the order of the two cutting planes has the effect of reducing the maximum welding surface area to 2.836 square inches.

Figure 13:
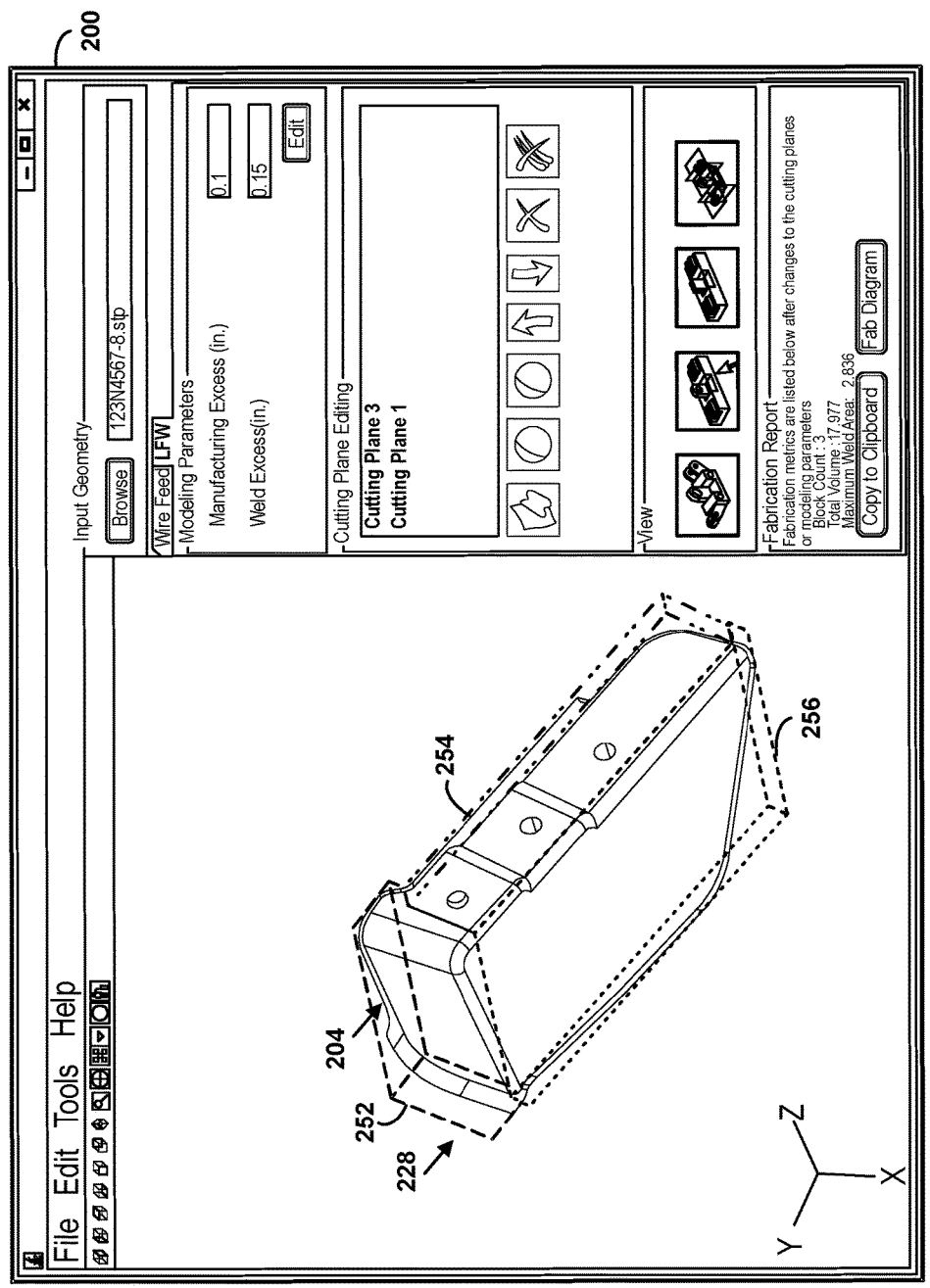
FIG. 13 illustrates additional features of the example GUI, according to an example embodiment.

FIG. 13 illustrates a pre-excess view of the updated preform geometry determined by the computing device after the change in the ordering of the cutting planes. The visual representation 228 shown in FIG. 13 includes a seventh depiction 252 of a seventh set of minimum-volume bounding boxes, an eighth depiction 254 of an eighth set of minimum-volume bounding boxes, and a ninth depiction 256 of a ninth set of minimum-volume bounding boxes. The seventh set of minimum-volume bounding boxes includes a single seventh minimum-volume bounding box, the eighth set of minimum-volume bounding boxes includes a single eighth minimum-volume bounding box, and the ninth set of minimum-volume bounding boxes includes a single ninth minimum-volume bounding box.

To fabricate a preform having the preform geometry shown in FIG. 13, a first block of raw material that is the size of the eighth minimum-volume bounding box may be welded to a second block of raw material that is the size of the ninth minimum-volume bounding box. The combination of the first block and the second block may then be welded to a third block of raw material that is the size of the seventh minimum-volume bounding box.

Figure 14:
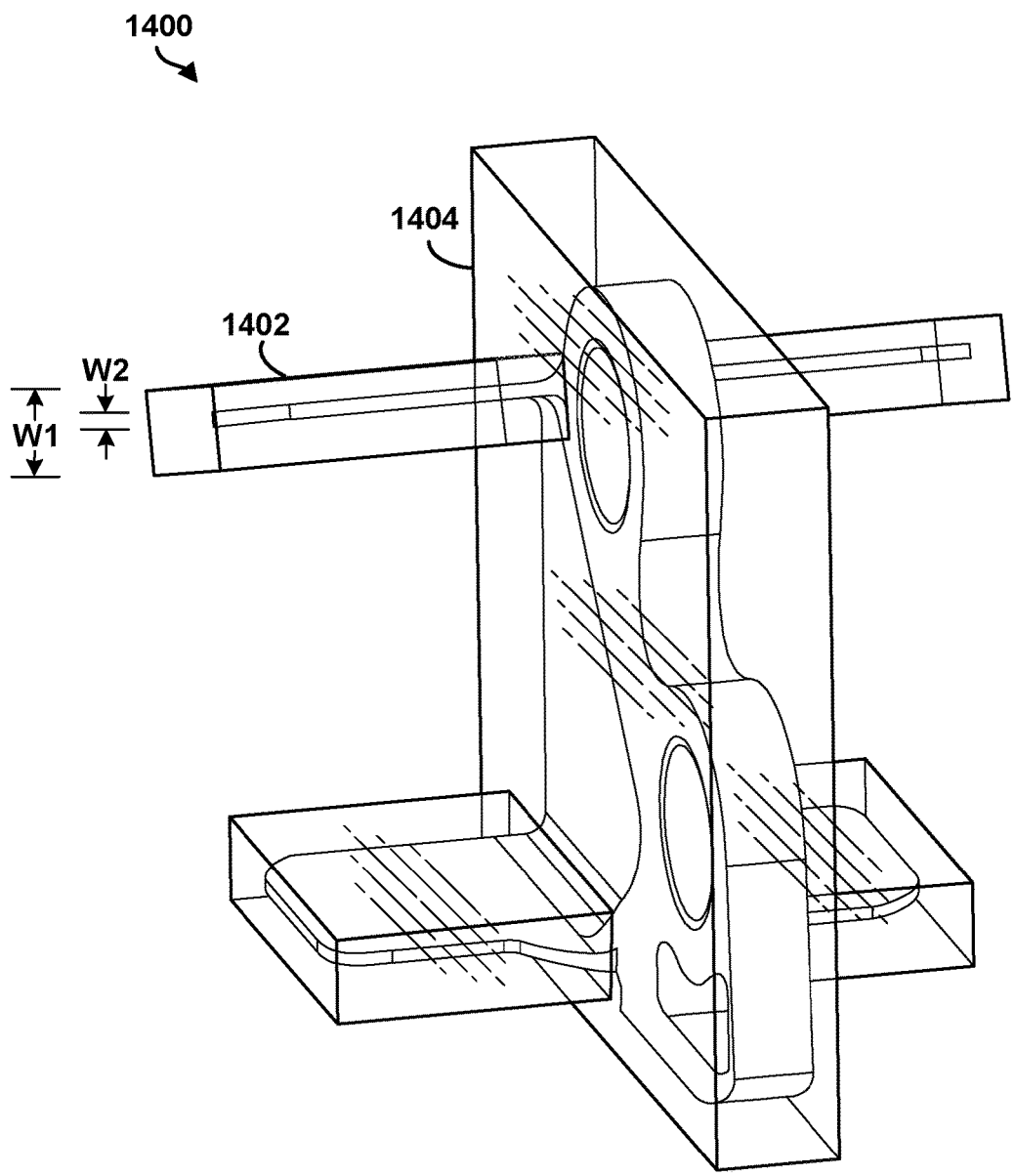
FIG. 14 illustrates an example preform geometry, according to an example embodiment.

FIG. 14 illustrates another example preform geometry 1400 which may be designed using the GUI 200 of FIG. 2. The preform geometry 1400 includes five rectangular blocks. The sizes of the blocks have been augmented to account for manufacturing excess. As shown in FIG. 14, a width W1 of a first block 1402 is wider than a width W2 of a section of a part that may be machined from the block 1402. The blocks have also been augmented to account for weld excess. For instance, a length of the first block 1402 has been increased in direction normal to a surface of a second block 1404 to which the first block is joined to form a preform having the preform geometry. The preform geometry 1400 may be useful for fabricating a preform, which can then be machined to form a bracket for a vehicle (e.g., an aircraft, ship, or automobile).

Figure 15:
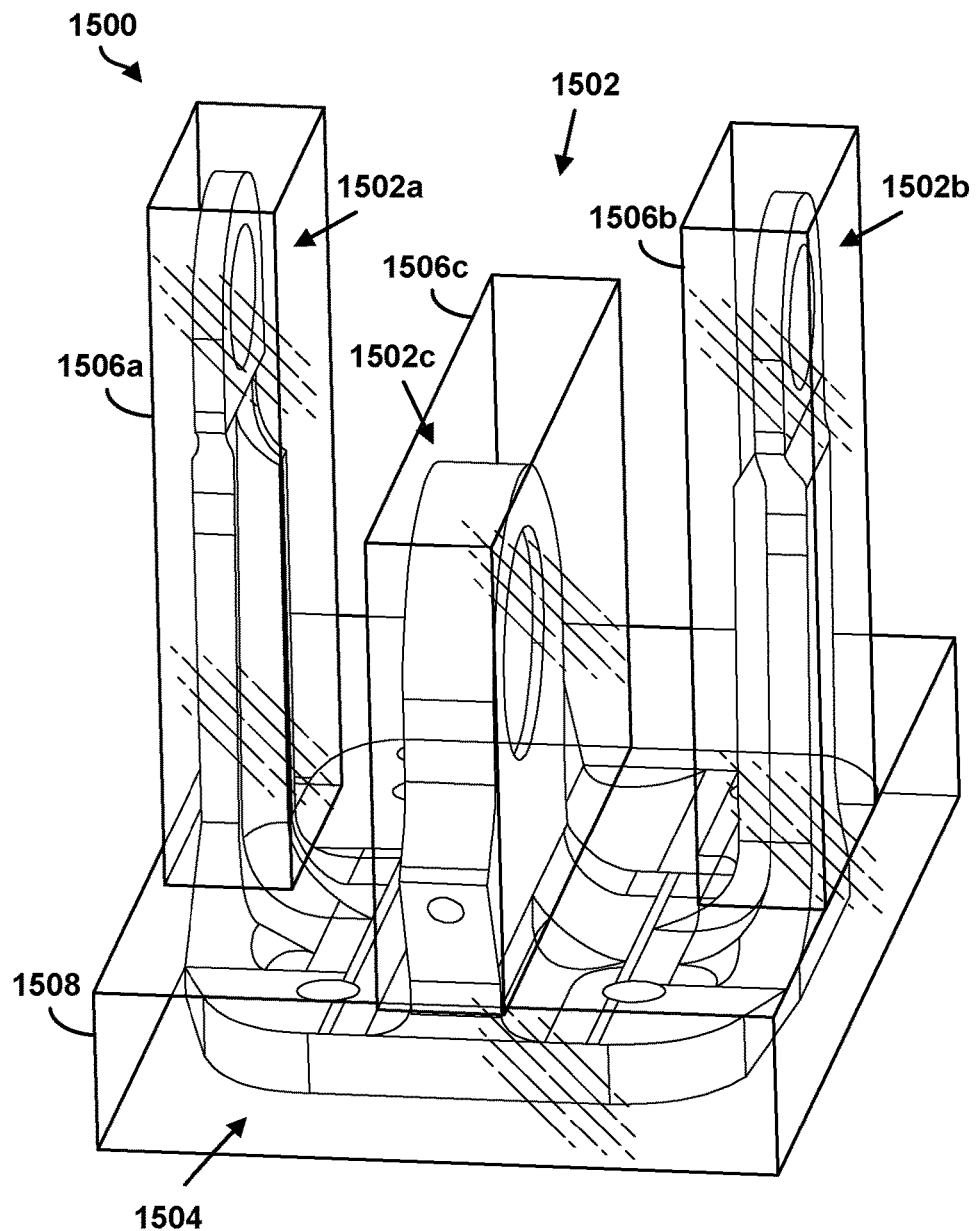
FIG. 15 illustrates another example preform geometry, according to an example embodiment.

FIG. 15 illustrates another example preform geometry 1500 which may be designed using the GUI 200. A preform having the preform geometry 1500 may be machined to produce a part. For instance, a preform having the preform geometry 1500 may be machined to produce a bracket for a vehicle. The preform geometry 1500 has a volume of 48.99 cubic inches. In contrast, if the part were machined from a single rectangular block, the single rectangular block would have a volume of at least 172.4 cubic inches.

The preform geometry 1500 is designed by defining a single cutting plane. The single cutting plane divides the part into a first portion 1502 and a second portion 1504. The first portion 1502 has three connected subsets of geometry 1502a, 1502b, and 1502c. The preform geometry includes a first set of minimum-volume bounding boxes 1506 and a second set of minimum-volume bounding boxes 1508. The first set of minimum-volume bounding boxes 1506 includes three minimum-volume bounding boxes 1506a, 1506b, 1506c that enclose the three connected subsets of geometry 1502a, 1502b, and 1502c, respectively, and are tangent to the cutting plane.

Figure 16:
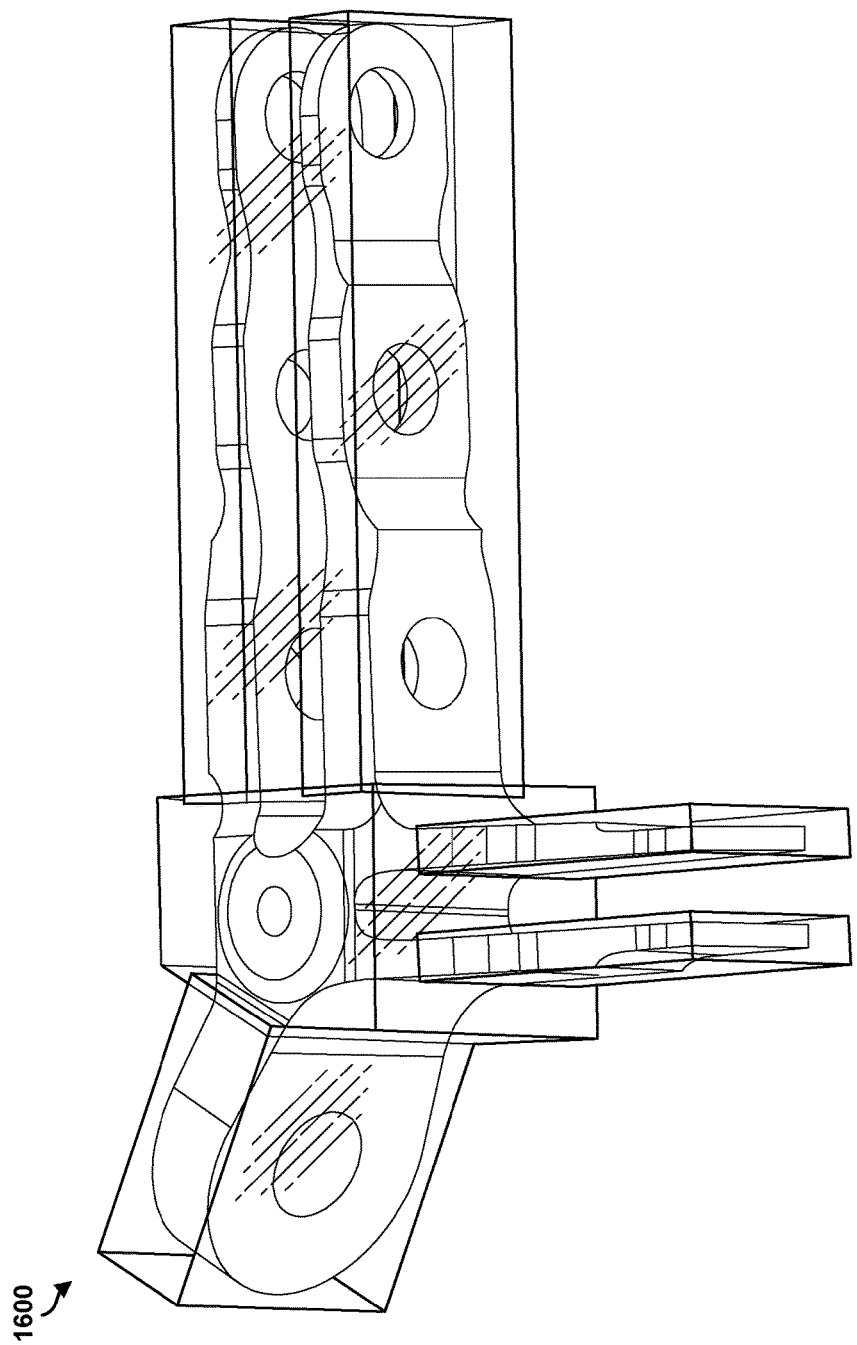
FIG. 16 illustrates another example preform geometry, according to an example embodiment.

FIG. 16 illustrates still another example preform geometry 1600 which may be designed using the GUI 200. A preform having the preform geometry 1600 may be machined to produce a part, such as an assembly for a vehicle.

Figure 17:
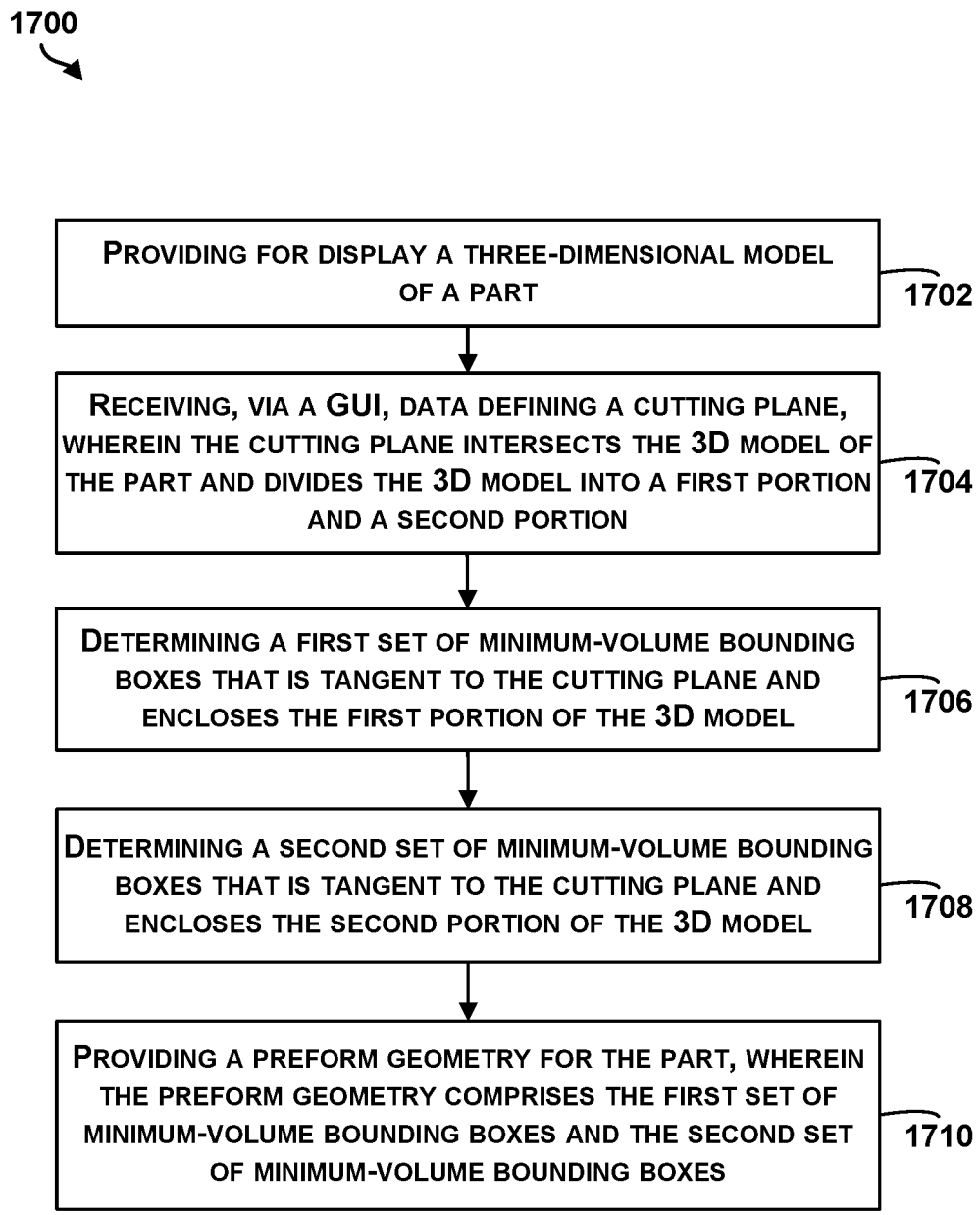
FIG. 17 shows a flowchart of an example method, according to an example embodiment.

FIG. 17 shows a flowchart of an example method 1700 for determining a preform geometry, according to an example embodiment. Method 1700 shown in FIG. 17 presents an embodiment of a method that, for example, could be carried out by the computing device 100 as shown and described herein, for example. It should be understood that for this and other processes and methods disclosed herein, flowcharts show functionality and operation of one possible implementation of present embodiments. Alternative implementations are included within the scope of the example embodiments of the present disclosure in which functions may be executed out of order from that shown or discussed, including substantially concurrent or in reverse order, depending on the functionality involved, as would be understood by those reasonably skilled in the art.

Further, each block of this and other methods may represent a module, a segment, or a portion of program code, which includes one or more instructions executable by a processor for implementing specific logical functions or steps in the process. The program code may be stored on any type of computer readable medium or data storage, for example, such as a storage device including a disk or hard drive. The computer readable medium may include non-transitory computer readable medium or memory, for example, such as computer readable media that stores data for short periods of time like register memory, processor cache, and RAM. The computer readable media may also be any other volatile or non-volatile storage systems. The computer readable medium may be considered a tangible computer readable storage medium, for example.

At block 1702, the method 1700 includes providing for display a 3D model of a part. The 3D model of the part may be provided for display within an interactive GUI, such as the GUI 200 of FIG. 2. In some examples, the 3D model of the part may also be received via the interactive GUI. For instance, a user may specify a file location of the 3D model of the part via the GUI.

At block 1704, the method 1700 includes receiving, via a GUI, data defining a cutting plane. The cutting plane intersects the 3D model of the part and divides the 3D model into a first portion and a second portion. The GUI may be an interactive GUI such as the GUI 200. In one example, the data may include an in-plane point on the 3D model and a normal point on the 3D model.

At block 1706, the method 1700 includes determining a first set of minimum-volume bounding boxes that is tangent to the cutting plane and encloses the first portion of the 3D model.

At block 1708, the method 1700 includes determining a second set of minimum-volume bounding boxes that is tangent to the cutting plane and encloses the second portion of the 3D model.

At block 1710, the method 1700 includes providing a preform geometry for the part. The preform geometry comprises the first set of minimum-volume bounding boxes and the second set of minimum-volume bounding boxes. Providing the preform geometry may include determining an initial geometry that includes the first set of minimum-volume bounding boxes and the second set of minimum-volume bounding boxes, and providing a preform geometry that augments the initial geometry to account for manufacturing excess and/or weld excess.

Figure 18:
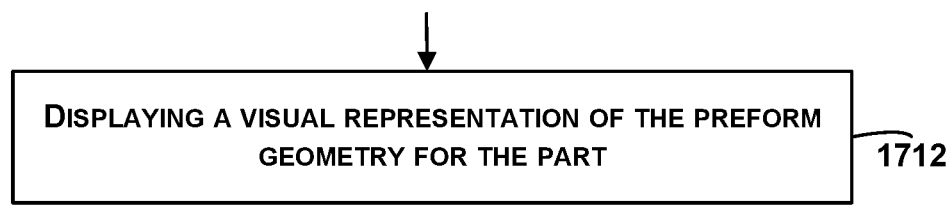
FIG. 18 shows a flowchart of another example method for use with the method shown in FIG. 17, according to an example embodiment.

FIG. 18 shows a flowchart of an example method for use with the method 1700 shown in FIG. 17. At block 1712, FIG. 18 includes displaying a visual representation of the preform geometry for the part. For instance the visual representation may be displayed overlaying the 3D model of the part. The visual representation of the preform geometry may be at least partially transparent.

Figure 19:
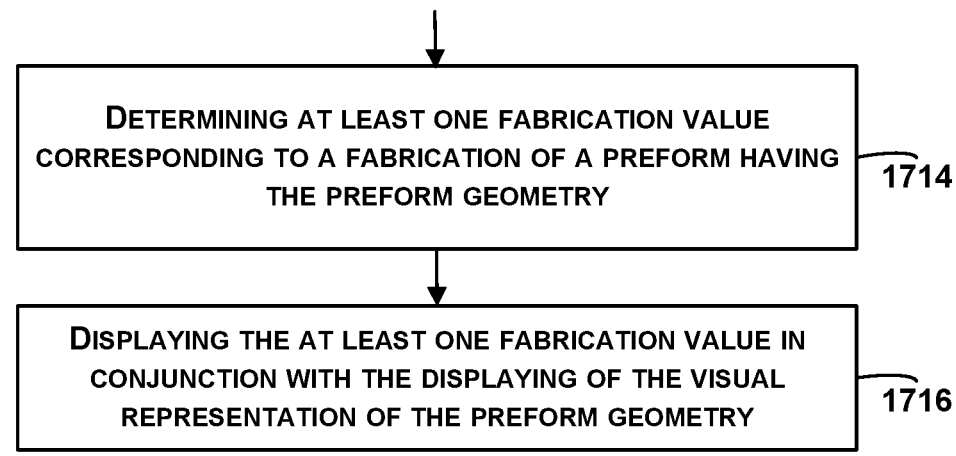
FIG. 19 shows a flowchart of another example method for use with the method shown in FIGS. 17 and 18, according to an example embodiment.

FIG. 19 shows a flowchart of another example method for use with the method 1700 shown in FIGS. 17 and 18. At block 1714, FIG. 19 includes determining at least one fabrication value corresponding to a fabrication of a preform having the preform geometry. And at block 1716, FIG. 19 includes displaying the at least one fabrication value in conjunction with the displaying of the visual representation of the preform geometry. For instance, the preform may be a LFW preform, and the at least one fabrication value may include a maximum welding surface area. The at least one fabrication value may additionally or alternatively include a total volume of the preform geometry.

Figure 20:
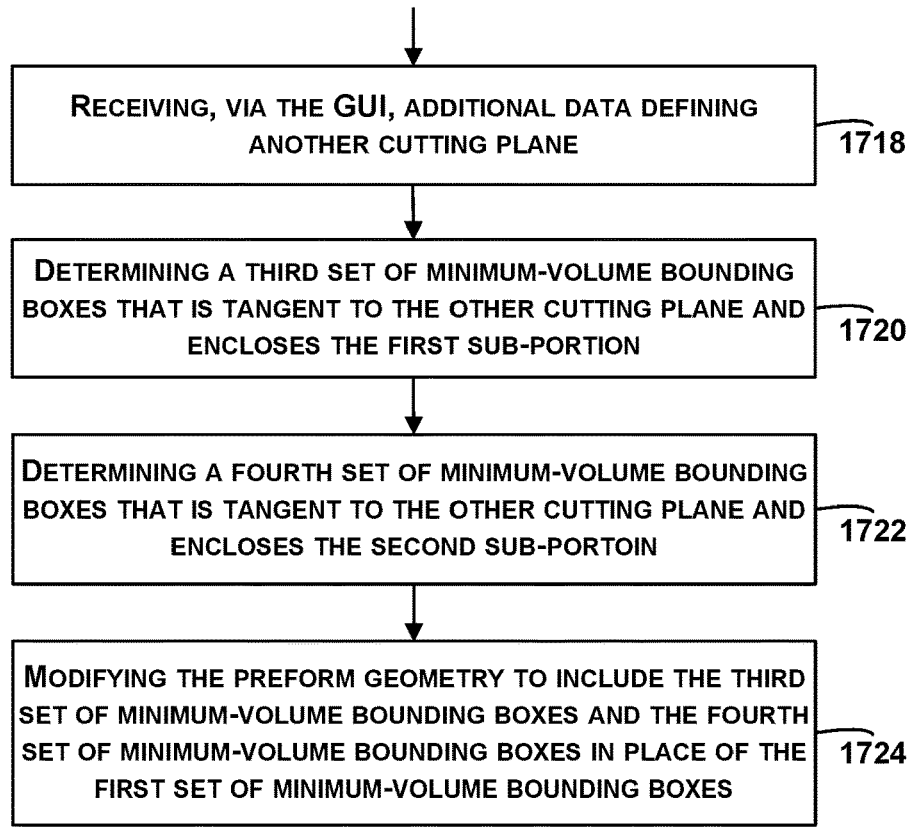
FIG. 20 shows a flowchart of another example method for use with the method shown in FIG. 17, according to an example embodiment.

FIG. 20 shows a flowchart of another example method for use with the method 1700 shown in FIG. 17. At block 1718, FIG. 20 includes receiving, via the GUI, additional data defining another cutting plane. For instance, the other cutting plane may intersect the first portion of the 3D model and divide the first portion into a third portion and a fourth portion. At block 1720, FIG. 20 includes determining a third set of minimum-volume bounding boxes that is tangent to the other cutting plane and encloses the first sub-portion. At block 1722, FIG. 20 includes determining a fourth set of minimum-volume bounding boxes that is tangent to the other cutting plane and encloses the second sub-portion. And at block 1724, FIG. 20 includes modifying the preform geometry to include the third set of minimum-volume bounding boxes and the fourth set of minimum-volume bounding boxes in place of the first set of minimum-volume bounding boxes.

Figure 21:
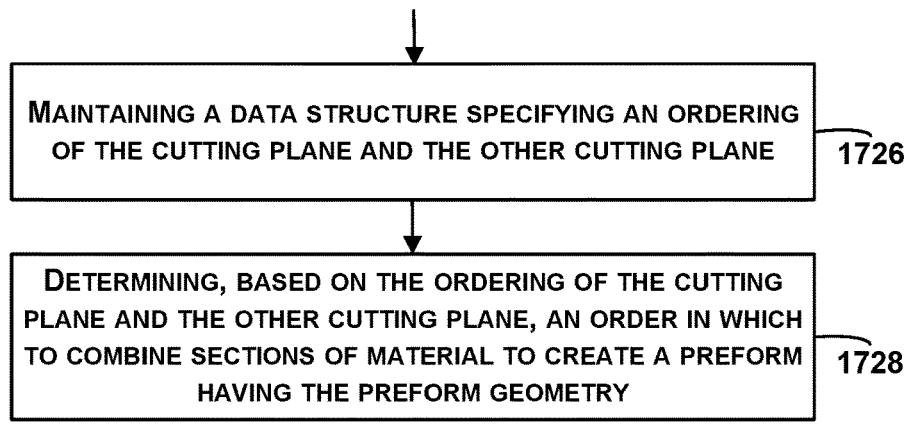
FIG. 21 shows a flowchart of another example method for use with the method shown in FIGS. 17 and 20, according to an example embodiment.

FIG. 21 shows a flowchart of another example method for use with the method 1700 shown in FIGS. 17 and 20. At block 1726, FIG. 21 includes maintaining a data structure specifying an ordering of the cutting plane and the other cutting plane. And at block 1728, FIG. 21 includes determining, based on the ordering of the cutting plane and the other cutting plane, an order in which to combine sections of material to create a preform having the preform geometry. In some instances, a fabrication diagram specifying the order may also be provided.

In one example, the method 1700 may further include outputting a preform geometry file specifying the preform geometry. The preform geometry file may be a 3D modeling file.

Figure 22:
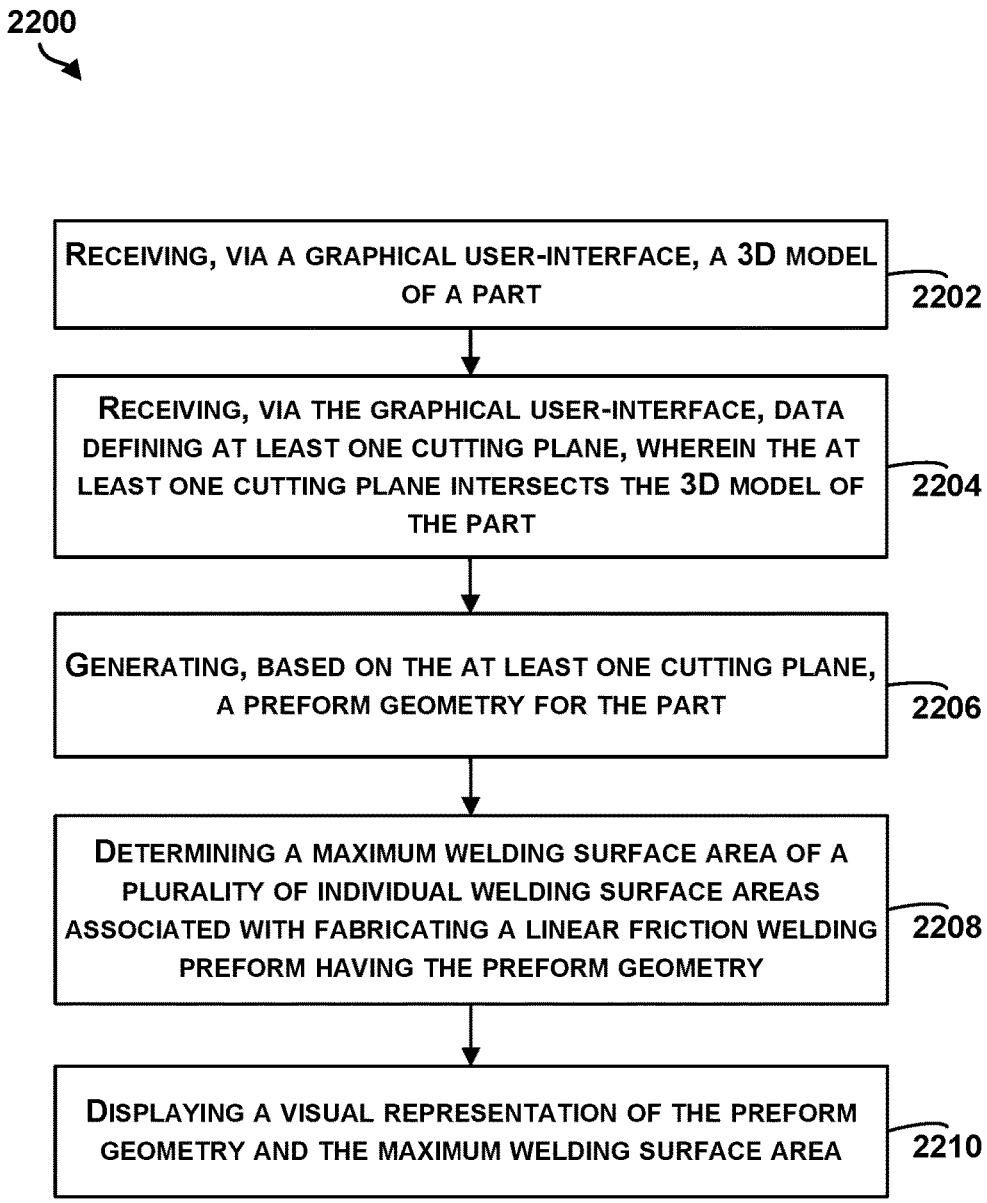
FIG. 22 shows a flowchart of another example method, according to an example embodiment.

FIG. 22 shows a flowchart of another example method 2200 for determining a preform geometry, according to an example embodiment. Method 2200 shown in FIG. 22 presents an embodiment of a method that, for example, could be carried out by the computing device 100 as shown and described herein, for example.

At block 2202, the method 2200 includes receiving, via a GUI, a 3D model of a part. For instance, the GUI may receive data indicating a file location of the 3D model.

At block 2204, the method 2200 includes receiving, via the GUI, data defining at least one cutting plane. The at least one cutting plane intersects the 3D model of the part.

At block 2206, the method 2200 includes generating, based on the at least one cutting plane, a preform geometry for the part. Determining the preform geometry may involve dividing the 3D model into a first portion and a second portion based on a definition of a first cutting plane of the at least two cutting planes, and then determining first and second sets of minimum-volume bounding boxes that are tangent to the first cutting plane and enclose the first and second portions, respectively. Further, if the at least one cutting plane also includes a second cutting plane, based on the definition of the second cutting plane, either the first or second portion may then be divided into a first sub-portion and a second-sub portion. If, for instance, an in-plane point of the second cutting plane lies in the first portion, the first portion may be divided, and vice versa. After the first and second sub-portions are defined, third and fourth sets of minimum-volume bounding boxes that enclose the first and second sub-portions, respectively, and are tangent to the second cutting plane may be determined. If the at least one cutting plane further includes a third cutting plane, the portion or sub-portion in which the in-plane point defining the third cutting plane lies may be divided into two sub-portions, and two sets of minimum-volume bounding boxes enclosing the two sub-portions and tangent to the third cutting plane may be determined.

This process may be repeated until each of the cutting planes has been accounted for. After all the cutting planes have been accounted for, the resulting preform geometry may be the combination of the sets of minimum-volume bounding boxes that enclose the portions and sub-portions. If any particular portion or sub-portion was split into two smaller portions by a cutting plane, the set of minimum-volume bounding boxes corresponding to that particular portion or sub-portion may be disregarded.

At block 2208, the method 2200 includes determining a maximum welding surface area of a plurality of individual welding surface areas associated with fabricating an LFW preform having the preform geometry. By way of example, the at least one cutting plane may include a single first cutting plane. Further, the preform geometry may include a first set of minimum-volume bounding boxes and a second set of minimum-volume bounding boxes, with the first set including a first and second minimum-volume bounding box and the second set including a third minimum-volume bounding box. A computing device may then: (i) determine a first welding surface area by calculating an area of the intersection of the first minimum-volume bounding box, the third minimum-volume bounding box, and the first cutting plane; (ii) determining a second welding surface area by calculating the area of the intersection of the second minimum-volume bounding box, the third minimum-volume bounding box, and the first cutting plane; and (iii) selecting the larger of the first welding surface area and the second welding surface area.

At block 2210, the method 2200 includes displaying a visual representation of the preform geometry and the maximum welding surface area.

Figure 23:
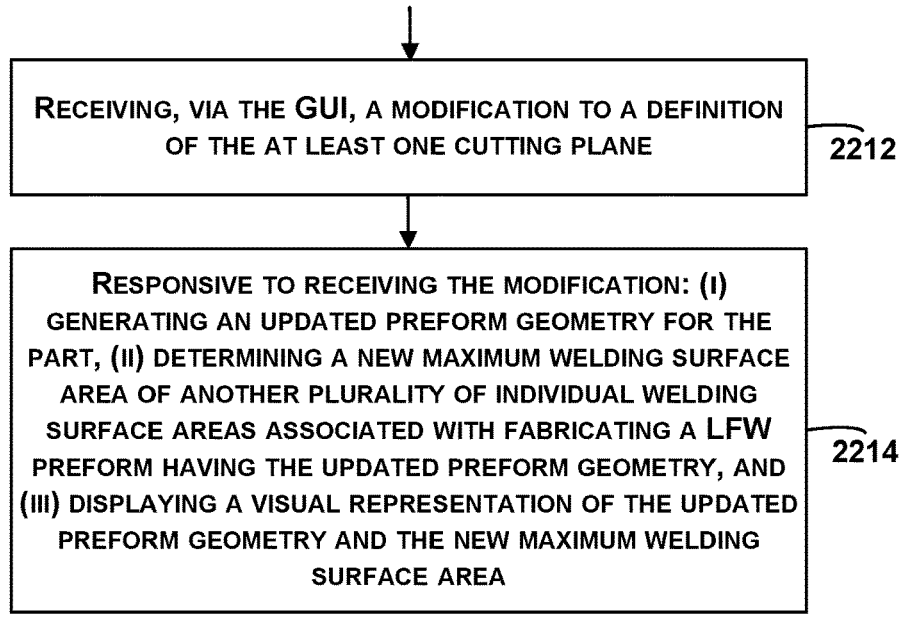
FIG. 23 shows a flowchart of another example method for use with the method shown in FIG. 22, according to an example embodiment.

FIG. 23 shows a flowchart of another example method for use with the method 2200 shown in FIG. 22. At block 2212, FIG. 23 includes receiving, via the GUI, a modification to a definition of the at least one cutting plane. And at block 2214, FIG. 23 includes, responsive to receiving the modification: (i) generating an updated preform geometry for the part, (ii) determining a new maximum welding surface area of another plurality of individual welding surface areas associated with fabricating a LFW preform having the updated preform geometry, and (iii) displaying a visual representation of the updated preform geometry and the new maximum welding surface area.

Figure 24:
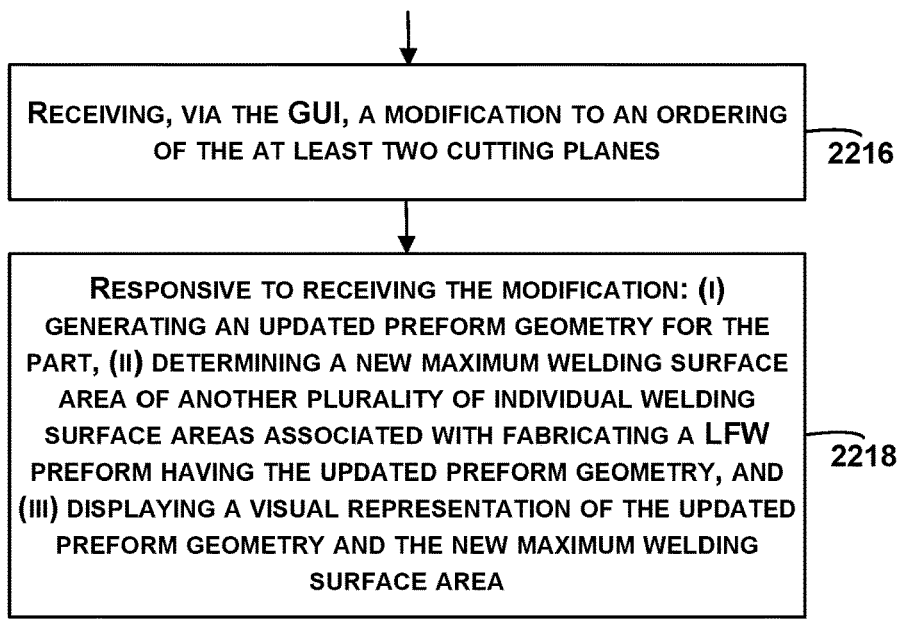
FIG. 24 shows a flowchart of another example method for use with the method shown in FIG. 22, according to an example embodiment.

FIG. 24 shows a flowchart of another example method for use with the method 2200 shown in FIG. 22. The method may be used when the at least one cutting plane includes at least two cutting planes. At block 2216, FIG. 24 includes receiving, via the GUI, a modification to an ordering of the at least two cutting planes. And at block 2218, FIG. 24 includes, responsive to receiving the modification: (i) generating an updated preform geometry for the part, (ii) determining a new maximum welding surface area of another plurality of individual welding surface areas associated with fabricating a LFW preform having the updated preform geometry, and (iii) displaying a visual representation of the updated preform geometry and the new maximum welding surface area.

The description of the different advantageous arrangements has been presented for purposes of illustration and description, and is not intended to be exhaustive or limited to the examples in the form disclosed. After reviewing and understanding the foregoing disclosure, many modifications and variations will be apparent to those of ordinary skill in the art. Further, different examples may provide different advantages as compared to other examples. The example or examples selected are chosen and described in order to best explain the principles, the practical application, and to enable others of ordinary skill in the art to understand the disclosure for various examples with various modifications as are suited to the particular use contemplated.

What is claimed is:

1. A computer-implemented method, comprising:
   providing, by a computing device and for display, a three-dimensional (3D) model of a part;
   receiving, via a graphical user interface (GUI) of the computing device, data defining a cutting plane, wherein the cutting plane intersects the 3D model of the part and divides the 3D model into a first portion and a second portion;
   determining, by the computing device, a first set of minimum-volume bounding boxes that is tangent to the cutting plane and encloses the first portion of the 3D model;
   determining, by the computing device, a second set of minimum-volume bounding boxes that is tangent to the cutting plane and encloses the second portion of the 3D model; and
   providing, by the computing device, a preform geometry for the part, wherein the preform geometry comprises the first set of minimum-volume bounding boxes and the second set of minimum-volume bounding boxes.

2. The computer-implemented method of claim 1, further comprising displaying a visual representation of the preform geometry for the part, wherein the visual representation of the preform geometry overlays the 3D model of the part and is at least partially transparent.

3. The computer-implemented method of claim 2, further comprising:
   determining, by the computing device, at least one fabrication value corresponding to a fabrication of a preform having the preform geometry; and
   displaying, by the computing device, the at least one fabrication value in conjunction with the displaying of the visual representation of the preform geometry.

4. The computer-implemented method of claim 3, wherein the preform comprises a linear friction welding (LFW) preform, and wherein the at least one fabrication value comprises a maximum welding surface area during fabrication of the LFW preform.

5. The computer-implemented method of claim 3, wherein the at least one fabrication value comprises a total volume of the preform geometry.

6. The computer-implemented method of claim 1, wherein providing a preform geometry for the part comprises:
 determining an initial geometry that comprises the first set of minimum-volume bounding boxes and the second set of minimum-volume bounding boxes; and
 providing a preform geometry that augments the initial geometry to account for manufacturing excess.

7. The computer-implemented method of claim 3, wherein the preform comprises a linear friction welding (LFW) preform, and wherein providing a preform geometry for the part comprises:
 determining an initial geometry that comprises the first set of minimum-volume bounding boxes and the second set of minimum-volume bounding boxes; and
 providing a preform geometry that augments the initial geometry to account for weld excess.

8. The computer-implemented method of claim 1, further comprising:
 receiving, via the GUI of the computing device, additional data defining another cutting plane, wherein the other cutting plane intersects the first portion of the 3D model and divides the first portion of the 3D model into a first sub-portion and a second sub-portion;
 determining, by the computing device, a third set of minimum-volume bounding boxes that is tangent to the other cutting plane and encloses the first sub-portion;
 determining, by the computing device, a fourth set of minimum-volume bounding boxes that is tangent to the other cutting plane and encloses the second sub-portion; and
 modifying, by the computing device, the preform geometry to include the third set of minimum-volume bounding boxes and the fourth set of minimum-volume bounding boxes in place of the first set of minimum-volume bounding boxes.

9. The computer-implemented method of claim 8, further comprising:
 maintaining, by the computing device, a data structure specifying an ordering of the cutting plane and the other cutting plane;
 determining, by the computing device and based on the ordering of the cutting plane and the other cutting plane, an order in which to combine sections of material to create a preform having the preform geometry; and
 providing, by the computing device, a fabrication diagram specifying the order in which to combine the sections of material to create the preform.

10. The computer-implemented method of claim 1, wherein receiving, via a GUI of the computing device, data defining a cutting plane comprises:
 receiving, via a GUI of the computing device, a request to define a cutting plane;
 receiving data defining an in-plane point on the 3D model, wherein the in-plane point lies in the cutting plane; and
 receiving data defining a normal point on the 3D model, wherein a normal of the normal point is equal to a normal of the cutting plane.

11. A computing device comprising:
 a processor; and
 a non-transitory computer-readable medium having stored therein instructions that are executable to cause the computing device to perform functions comprising:
 receiving a three-dimensional (3D) model of a part,
 receiving data defining a cutting plane, wherein the cutting plane intersects the 3D model of the part and divides the 3D model into a first portion and a second portion,
 determining a first set of minimum-volume bounding boxes that is tangent to the cutting plane and encloses the first portion of the 3D model,
 determining a second set of minimum-volume bounding boxes that is tangent to the cutting plane and encloses the second portion of the 3D model, and
 determining a preform geometry for the part, wherein the preform geometry comprises the first set of minimum-volume bounding boxes and the second set of minimum-volume bounding boxes.

12. The computing device of claim 11, wherein the functions further comprise outputting a preform geometry file specifying the preform geometry.

13. The computing device of claim 11, wherein the functions further comprise determining at least one fabrication value corresponding to a fabrication of a preform having the preform geometry.

14. The computing device of claim 13, wherein the preform comprises a linear friction welding (LFW) preform, and wherein the at least one fabrication value comprises a maximum welding surface area during fabrication of the LFW preform.

15. The computing device of claim 13, wherein the at least one fabrication value comprises a total volume of the preform geometry.

16. The computing device of claim 11, wherein the functions further comprise displaying the 3D model of the part and a visual representation of the preform geometry within an interactive 3D model viewer, wherein the visual representation of the preform geometry comprises individual representations of the first set of minimum-volume bounding boxes and the second set of minimum-volume bounding boxes.

17. The computing device of claim 11, wherein the functions further comprise:
 receiving, via a graphical user interface, a modification to a definition of the cutting plane; and
 determining an updated preform geometry for the part based on the modification to the definition of the plane.

18. A computer-implemented method, comprising:
 receiving, via a graphical user interface (GUI) of a computing device, a 3D model of a part;
 receiving, via the GUI, data defining at least one cutting plane, wherein the at least one cutting plane intersects the 3D model of the part;
 generating, by the computing device and based on the at least one cutting plane, a preform geometry for the part;
 determining, by the computing device, a maximum welding surface area of a plurality of individual welding surface areas associated with fabricating a linear friction welding (LFW) preform having the preform geometry; and
 displaying, by the computing device, a visual representation of the preform geometry and the maximum welding surface area.

19. The computer-implemented method of claim 18, further comprising:
 receiving, via the GUI, a modification to a definition of the at least one cutting plane; and
 responsive to receiving the modification:
 generating an updated preform geometry for the part, determining a new maximum welding surface area of another plurality of individual welding surface areas associated with fabricating a LFW preform having the updated preform geometry, and displaying a visual representation of the updated preform geometry and the new maximum welding surface area.

20. The computer-implemented method of claim 18, wherein the at least one cutting plane comprises at least two cutting planes, and wherein the method further comprises:

receiving, via the GUI, a modification to an ordering of the at least two cutting planes; and responsive to receiving the modification:
  generating an updated preform geometry for the part,
  determining a new maximum welding surface area of another plurality of individual welding surface areas associated with fabricating a LFW preform having the updated preform geometry, and
  displaying a visual representation of the updated preform geometry and the new maximum welding surface area.

* * * * *